US012563927B2

(12) United States Patent
Cheon

(10) Patent No.: US 12,563,927 B2
(45) Date of Patent: Feb. 24, 2026

(54) DISPLAY APPARATUS AND METHOD OF MANUFACTURING THE SAME

(71) Applicant: Samsung Display Co., Ltd., Yongin-si (KR)

(72) Inventor: Soohong Cheon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 391 days.

(21) Appl. No.: 18/184,546

(22) Filed: Mar. 15, 2023

(65) Prior Publication Data

US 2023/0345777 A1    Oct. 26, 2023

(30) Foreign Application Priority Data

Apr. 26, 2022    (KR) ........................ 10-2022-0051659

(51) Int. Cl.
H10K 59/131        (2023.01)
H10K 59/12         (2023.01)
H10K 59/122        (2023.01)

(52) U.S. Cl.
CPC ....... H10K 59/131 (2023.02); H10K 59/1201 (2023.02); H10K 59/122 (2023.02)

(58) Field of Classification Search
CPC .................................................. H10K 59/131
See application file for complete search history.

(56) References Cited

U.S. PATENT DOCUMENTS

| | | | |
|---|---|---|---|
| 6,555,876 B2 | 4/2003 | Jun et al. | |
| 9,490,276 B2 | 11/2016 | Kim et al. | |
| 10,707,280 B2 | 7/2020 | Jeong et al. | |
| 2017/0155078 A1* | 6/2017 | Lee | H10K 71/60 |
| 2020/0006661 A1* | 1/2020 | Shinokawa | B23K 26/362 |

FOREIGN PATENT DOCUMENTS

| | | |
|---|---|---|
| JP | 2008-270768 A | 11/2008 |
| KR | 10-2003-0018620 A | 3/2003 |
| KR | 10-2021-0124141 A | 10/2021 |

* cited by examiner

*Primary Examiner* — Douglas M Menz

(74) *Attorney, Agent, or Firm* — Womble Bond Dickinson (US) LLP

(57)                ABSTRACT

A display apparatus includes: a substrate; an organic insulating layer on the substrate; a first electrode on the organic insulating layer; an auxiliary electrode on the organic insulating layer; intaglio patterns in the auxiliary electrode; a bank layer having a first bank opening overlapping with the first electrode, and a second bank opening overlapping with the auxiliary electrode; an intermediate layer on the first electrode and the auxiliary electrode, the intermediate layer having a hole exposing a portion of the auxiliary electrode; and a second electrode on the intermediate layer to overlap with the first electrode and the auxiliary electrode, and contacting the portion of the auxiliary electrode exposed through the hole in the intermediate layer.

20 Claims, 21 Drawing Sheets

DISPLAY APPARATUS AND METHOD OF MANUFACTURING THE SAME

CROSS-REFERENCE TO RELATED APPLICATION

This application claims priority to and the benefit of Korean Patent Application No. 10-2022-0051659, filed on Apr. 26, 2022, in the Korean Intellectual Property Office, the entire disclosure of which is incorporated by reference herein.

BACKGROUND

1. Field

Aspects of one or more embodiments of the present disclosure relate to a display apparatus, and a method of manufacturing the display apparatus.

2. Description of the Related Art

As the field of displays for visually expressing various electrical signal information is rapidly developing, various display apparatuses having excellent characteristics, such as thinness, reduced weight, and low power consumption, have been introduced.

Display apparatuses may include a liquid crystal display apparatus that does not emit light by itself and uses light from a backlight, or a light-emitting display apparatus that includes a display element capable of emitting light. The light-emitting display apparatus may include a display element including an emission layer.

The above information disclosed in this Background section is for enhancement of understanding of the background of the present disclosure, and therefore, it may contain information that does not constitute prior art.

SUMMARY

One or more embodiments of the present disclosure are directed to a display apparatus, and a method of manufacturing the display apparatus.

Additional aspects and features will be set forth, in part, in the description that follows, and in part, will be apparent from the description, or may be learned by practicing one or more of the presented embodiments of the present disclosure.

According to one or more embodiments of the present disclosure, a display apparatus includes: a substrate; an organic insulating layer on the substrate; a first electrode on the organic insulating layer; an auxiliary electrode on the organic insulating layer; intaglio patterns in the auxiliary electrode; a bank layer having a first bank opening overlapping with the first electrode, and a second bank opening overlapping with the auxiliary electrode; an intermediate layer on the first electrode and the auxiliary electrode, the intermediate layer having a hole exposing a portion of the auxiliary electrode; and a second electrode on the intermediate layer to overlap with the first electrode and the auxiliary electrode, and contacting the portion of the auxiliary electrode exposed through the hole in the intermediate layer.

In an embodiment, the intaglio patterns may include a first intaglio pattern, and a second intaglio pattern spaced from the first intaglio pattern in a first direction with respect to the hole.

In an embodiment, the intaglio patterns may further include a third intaglio pattern, and a fourth intaglio pattern spaced from the third intaglio pattern in a second direction crossing the first direction with respect to the hole.

In an embodiment, each of the intaglio patterns may have a rectangular shape.

In an embodiment, each of the intaglio patterns may have a polygonal shape.

In an embodiment, the intaglio patterns may be on the organic insulating layer.

In an embodiment, the display apparatus may further include: a common voltage line on the substrate; and an auxiliary common voltage line overlapping with the common voltage line, and electrically connected to the common voltage line through a first contact hole defined in at least one insulating layer located between the auxiliary common voltage line and the common voltage line.

In an embodiment, the display apparatus may further include an inorganic insulating layer in direct contact with an upper surface of the auxiliary common voltage line.

In an embodiment, the auxiliary electrode may be electrically connected to the auxiliary common voltage line through a second contact hole defined in the inorganic insulating layer and the organic insulating layer.

In an embodiment, the intermediate layer may include an emission layer, and the hole in the intermediate layer may penetrate through the emission layer.

According to one or more embodiments of the present disclosure, a method of manufacturing a display apparatus, includes: forming an organic insulating layer on a substrate; forming a conductive material layer on the organic insulating layer; forming a first electrode, an auxiliary electrode, and intaglio patterns by patterning the conductive material layer; forming a bank layer on the first electrode, the auxiliary electrode, and the intaglio patterns, the bank layer having a first bank opening and a second bank opening; forming an intermediate layer on the first electrode, the auxiliary electrode, and the bank layer; and forming a hole exposing a portion of the auxiliary electrode by irradiating a laser beam to the intermediate layer overlapping with the auxiliary electrode, by utilizing the intaglio patterns.

In an embodiment, the forming of the hole may include: recognizing the intaglio patterns; determining an irradiation point of the laser beam by utilizing the recognized intaglio patterns; and forming the hole exposing the portion of the auxiliary electrode, by irradiating the laser beam to the determined irradiation point of the laser beam.

In an embodiment, the intaglio patterns may include a first intaglio pattern, and a second intaglio pattern spaced from the first intaglio pattern in a first direction.

In an embodiment, the intaglio patterns may further include a third intaglio pattern, and a fourth intaglio pattern spaced from the third intaglio pattern in a second direction crossing the first direction.

In an embodiment, the recognizing of the intaglio patterns may include recognizing the first intaglio pattern, the second intaglio pattern, the third intaglio pattern, and the fourth intaglio pattern.

In an embodiment, the irradiation point of the laser beam may be a point at which a first imaginary line passing through the first intaglio pattern and the second intaglio pattern intersects a second imaginary line passing through the third intaglio pattern and the fourth intaglio pattern.

In an embodiment, each of the intaglio patterns may have a rectangular shape.

In an embodiment, each of the intaglio patterns may have a polygonal shape.

In an embodiment, the intaglio patterns may be formed concurrently with the first electrode and the auxiliary electrode when the first electrode and the auxiliary electrode are formed.

In an embodiment, the method may further include forming a second electrode on the auxiliary electrode and the intermediate layer.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
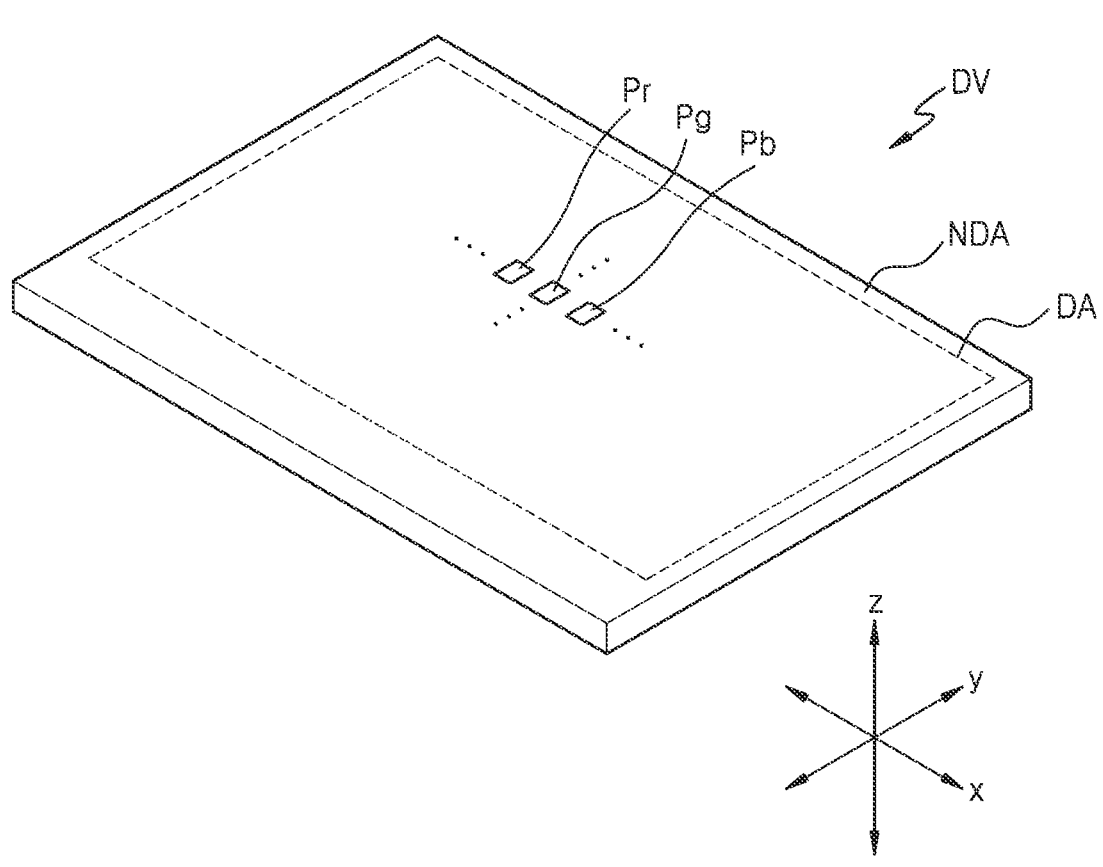
FIG. 1 is a schematic perspective view of a display apparatus according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, region, or component is referred to as being "formed on" another layer, region, or component, it can be directly or indirectly formed on the other layer, region, or component. In other words, for example, one or more intervening layers, regions, or components may be present. When a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic perspective view of a display apparatus DV according to an embodiment.

Referring to FIG. 1, the display apparatus DV may include a display area DA, and a non-display area NDA outside the display area DA. The display apparatus DV may provide an image through an array of a plurality of pixels that are two-dimensionally arranged on an x-y plane at (e.g., in or on) the display area DA. The plurality of pixels may include a first pixel Pr, a second pixel Pg, and a third pixel Pb. Hereinafter, for convenience, a case in which the first pixel Pr is a red pixel Pr, the second pixel Pg is a green pixel Pg, and the third pixel Pb is a blue pixel Pb will be described in more detail, but the present disclosure is not limited to these colors.

The red pixel Pr, the green pixel Pg, and the blue pixel Pb are regions capable of emitting red light, green light, and blue light, respectively. The display apparatus DV may provide an image by using light emitted from the red pixel Pr, the green pixel Pg, and the blue pixel Pb.

The non-display area NDA is an area that does not provide an image, and may entirely surround (e.g., around a periphery of) the display area DA. A driver or a main voltage line configured to provide an electrical signal or power to pixel circuits may be arranged at (e.g., in or on) the non-display area NDA. The non-display area NDA may include a pad, which is an area to which an electronic device or a printed circuit board may be electrically connected.

The display area DA may have a polygonal shape including a quadrangle shape, as shown in FIG. 1. For example, the display area DA may have a rectangular shape in which a horizontal length thereof is greater than a vertical length thereof, a rectangular shape in which a horizontal length thereof is less than a vertical length thereof, or a square shape. However, the present disclosure is not limited thereto, and the display area DA may have various suitable shapes, such as another polygonal shape, an ellipse shape, or a circle shape.

Figure 2:
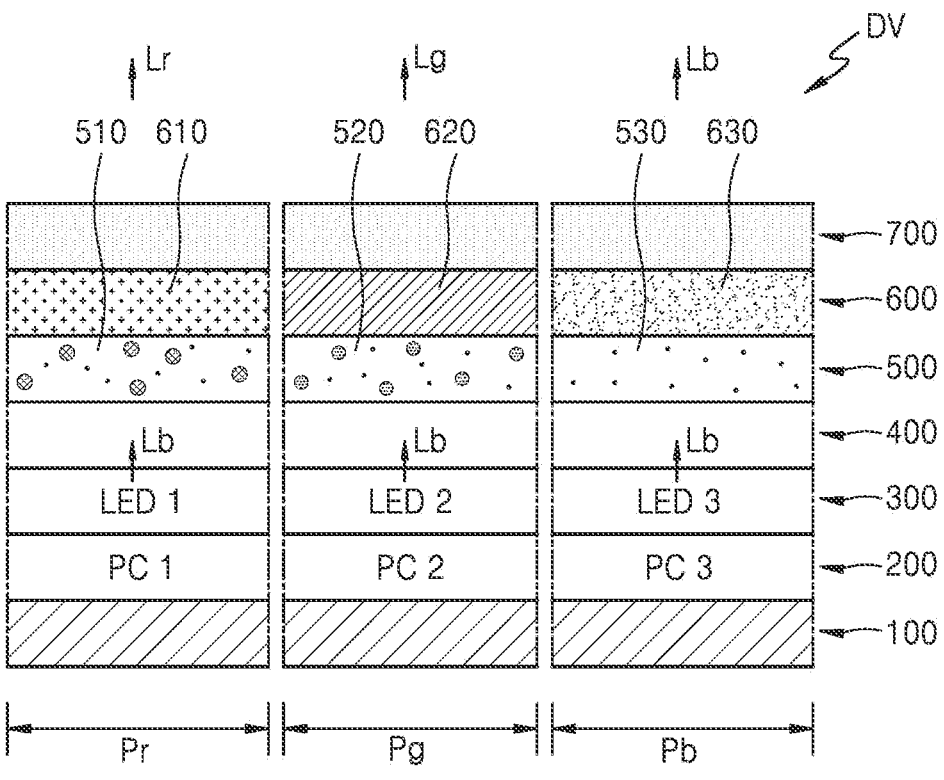
FIG. 2 is a schematic cross-sectional view of pixels of a display apparatus according to an embodiment.

FIG. 2 is a schematic cross-sectional view of pixels of a display apparatus DV according to an embodiment.

Referring to FIG. 2, the display apparatus DV may include a substrate 100, and a circuit layer 200 on the substrate 100. The circuit layer 200 may include first to third pixel circuits PC1, PC2, and PC3, and the first to third pixel circuits PC1, PC2, and PC3 may be electrically connected to first to third light-emitting diodes LED1, LED2, and LED3, respectively, of a light-emitting diode layer 300.

Each of the first to third light-emitting diodes LED1, LED2, and LED3 may be an organic light-emitting diode including an organic material. As another example, each of the first to third light-emitting diodes LED1, LED2, and LED3 may be an inorganic light-emitting diode including an inorganic material. The inorganic light-emitting diode may include a PN junction diode including inorganic semiconductor-based materials. When a voltage is applied to the PN junction diode in a forward direction, holes and electrons may be injected, and energy generated by recombination of the holes and the electrons may be converted into light energy to emit light of a suitable color (e.g., a predetermined color). The inorganic light-emitting diode may have a width of several to several hundred micrometers or several to several hundred nanometers. As another example, each of the first to third light-emitting diodes LED1, LED2, and LED3 may be a light-emitting diode including quantum dots. As described above, an emission layer of each of the first to third light-emitting diodes LED1, LED2, and LED3 may include an organic material, an inorganic material, quantum dots, an organic material and quantum dots, or an inorganic material and quantum dots.

The first to third light-emitting diodes LED1, LED2, and LED3 may emit light having the same color as each other. For example, light (e.g., blue light Lb), which may also be referred to as source light, emitted from the first to third light-emitting diodes LED1, LED2, and LED3 may pass through an encapsulation layer 400 on the light-emitting diode layer 300, and may further pass through a color conversion-transmitting layer 500.

The color conversion-transmitting layer 500 may include optical portions that transmit the light (e.g., the blue light Lb) emitted from the light-emitting diode layer 300, with or without converting the color of the light. For example, the color conversion-transmitting layer 500 may include color conversion portions that convert the light (e.g., the blue light Lb) emitted from the light-emitting diode layer 300 into light of another color, and a transmissive portion 530 that transmits the light (e.g., the blue light Lb) emitted from the light-emitting diode layer 300 without converting the color of the light. The color conversion-transmitting layer 500 may include a first color conversion portion 510 corresponding to the red pixel Pr, a second color conversion portion 520 corresponding to the green pixel Pg, and the transmissive portion 530 corresponding to the blue pixel Pb. The first color conversion portion 510 may convert the blue light Lb (e.g., the source light) into red light Lr, and the second color conversion portion 520 may convert the blue light Lb (e.g., the source light) into green light Lg. The transmissive portion 530 may allow the blue light Lb (e.g., the source light) to pass therethrough, without converting the blue light Lb (e.g., the source light).

A color layer 600 may be disposed on the color conversion-transmitting layer 500. The color layer 600 may include first to third color filters 610, 620, and 630 having different colors from each other. For example, the first color filter 610 may be a red color filter, the second color filter 620 may be a green color filter, and the third color filter 630 may be a blue color filter.

Light that is color-converted through the color conversion-transmitting layer 500 and light that is transmitted therethrough may pass through the first to third color filters 610, 620, and 630, and thus, color purity may be improved. Also, the color layer 600 may prevent or reduce external light (e.g., light incident from the outside of the display apparatus DV toward the display apparatus DV) from being reflected and recognized by a user.

A light-transmitting base layer 700 may be provided on the color layer 600. The light-transmitting base layer 700 may include glass or a light-transmitting organic material. For example, the light-transmitting base layer 700 may include the light-transmitting organic material, such as an acrylic resin.

As an embodiment, the light-transmitting base layer 700 may be a kind of substrate, and after the color layer 600 and the color conversion-transmitting layer 500 are formed on the light-transmitting base layer 700, the color conversion-transmitting layer 500 may be disposed to face the encapsulation layer 400.

As another example, after the color conversion-transmitting layer 500 and the color layer 600 are sequentially formed on the encapsulation layer 400, the light-transmitting base layer 700 may be directly applied and cured on the color layer 600. In some embodiments, another optical film, such as an anti-reflection (AR) film, may be disposed on the light-transmitting base layer 700.

The display apparatus DV having the above-described structure may be implemented in a television, a billboard, a screen for a movie theater, a monitor, a tablet personal computer (PC), a notebook computer, and/or the like.

Figure 3:
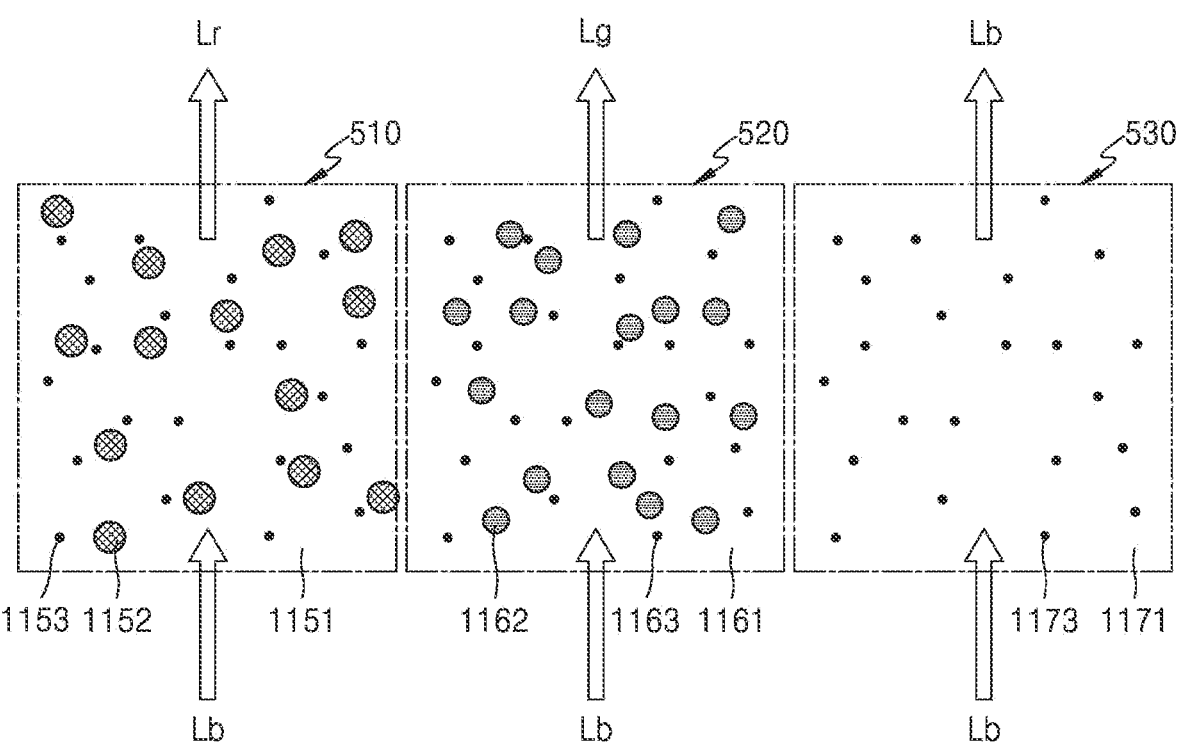
FIG. 3 illustrates optical portions of a color conversion-transmitting layer of FIG. 2.

FIG. 3 illustrates optical portions of the color conversion-transmitting layer 500 of FIG. 2.

Referring to FIG. 3, the first color conversion portion 510 may convert incident blue light Lb (e.g., the source light) into the red light Lr. As shown in FIG. 3, the first color conversion portion 510 may include a first photosensitive polymer 1151. First quantum dots 1152 and first scattering particles 1153 may be dispersed in the first photosensitive polymer 1151.

The first quantum dots 1152 may be excited by the blue light Lb to isotropically emit the red light Lr having a longer wavelength than that of the blue light Lb. The first photosensitive polymer 1151 may be an organic material having a suitable light transmittance. The first scattering particles 1153 may scatter the blue light Lb that is not absorbed by the first quantum dots 1152, so that more first quantum dots 1152 are excited, thereby increasing color conversion efficiency. The first scattering particles 1153 may be, for example, titanium oxide ($TiO_2$) particles or metal particles. The first quantum dots 1152 may be selected from a Group II-VI compound, a Group III-V compound, a Group IV-VI compound, a Group IV element, a Group IV compound, and/or a suitable combination thereof.

The second color conversion portion 520 may convert incident blue light Lb (e.g., the source light) into the green light Lg. As shown in FIG. 3, the second color conversion portion 520 may include a second photosensitive polymer 1161. Second quantum dots 1162 and second scattering particles 1163 may be dispersed in the second photosensitive polymer 1161.

The second quantum dots 1162 may be excited by the blue light Lb to isotropically emit the green light Lg having a longer wavelength than that of the blue light Lb. The second photosensitive polymer 1161 may be an organic material having a suitable light transmittance.

The second scattering particles 1163 may scatter the blue light Lb that is not absorbed by the second quantum dots 1162, so that more second quantum dots 1162 are excited, thereby increasing color conversion efficiency. The second scattering particles 1163 may be, for example, $TiO_2$ particles or metal particles. The second quantum dots 1162 may be selected from a Group II-VI compound, a Group III-V compound, a Group IV-VI compound, a Group IV element, a Group IV compound, and/or a suitable combination thereof.

In an embodiment, the first quantum dots 1152 and the second quantum dots 1162 may include the same or substantially the same material as each other. In this case, the sizes of the first quantum dots 1152 may be greater than the sizes of the second quantum dots 1162.

The transmissive portion 530 may transmit the blue light Lb (e.g., the source light), without converting the blue light Lb incident to the transmissive portion 530. As shown in FIG. 3, the transmissive portion 530 may include a third photosensitive polymer 1171, in which third scattering particles 1173 are dispersed. The third photosensitive polymer 1171 may be an organic material having a suitable light transmittance, such as a silicone resin or an epoxy resin. The third photosensitive polymer 1171 may include the same or substantially the same material as those of the first and second photosensitive polymers 1151 and 1161, which may include the silicone resin or the epoxy resin. The third scattering particles 1173 may scatter and emit the blue light Lb, and may include the same or substantially the same material as those of the first and second scattering particles 1153 and 1163.

Figure 4:
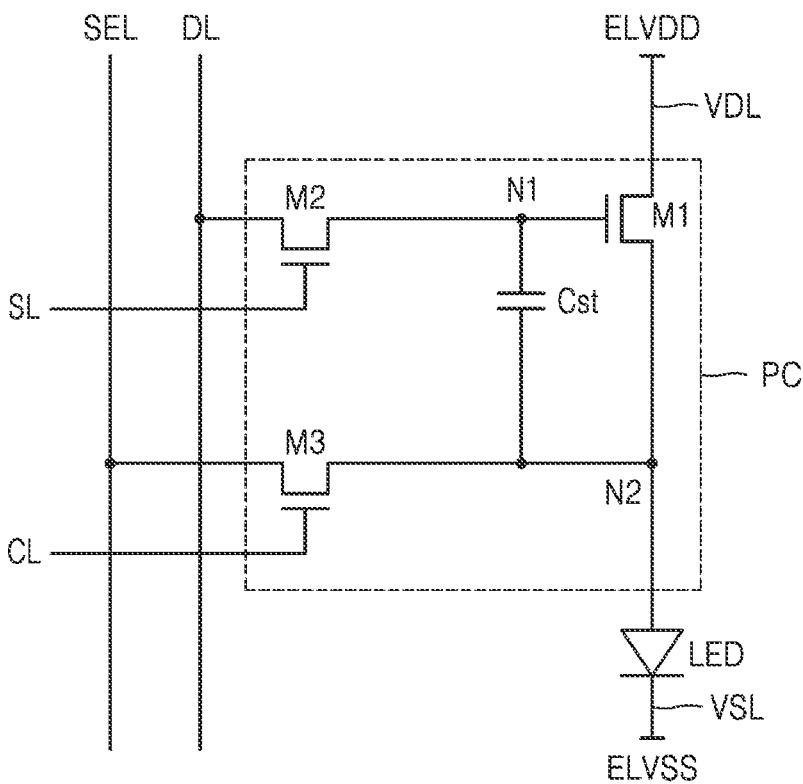
FIG. 4 is an equivalent circuit diagram of a pixel circuit electrically connected to a light-emitting diode included in a display apparatus according to an embodiment.

FIG. 4 is an equivalent circuit diagram of a pixel circuit PC electrically connected to a light-emitting diode LED included in a display apparatus according to an embodiment.

Referring to FIG. 4, a first electrode (e.g., an anode) of the light-emitting diode LED may be connected to the pixel circuit PC, and a second electrode (e.g., a cathode) of the light-emitting diode LED may be connected to a common voltage line VSL. The common voltage line VSL may be configured to provide a common power supply voltage ELVSS. The light-emitting diode LED may emit light having a desired luminance corresponding to an amount of current (e.g., a driving current) supplied thereto from the pixel circuit PC.

Each of the first to third light-emitting diodes LED1, LED2, and LED3 shown in FIG. 2 may have the same or substantially the same structure as that of the light-emitting diode LED shown in FIG. 4, and each of the first to third pixel circuits PC1, PC2, and PC3 shown in FIG. 2 may have the same or substantially the same structure as that of the pixel circuit PC shown in FIG. 4, and thus, redundant description thereof may not be repeated.

The pixel circuit PC may control the amount of current flowing from a driving power supply voltage ELVDD to the common power supply voltage ELVSS via the light-emitting diode LED in response to a data signal. The pixel circuit PC may include a driving transistor M1, a switching transistor M2, a sensing transistor M3, and a storage capacitor Cst.

Each of the driving transistor M1, the switching transistor M2, and the sensing transistor M3 may be an oxide semiconductor thin-film transistor including a semiconductor layer made of an oxide semiconductor, or a silicon semiconductor thin-film transistor including a semiconductor layer made of polysilicon. Each of the driving transistor M1, the switching transistor M2, and the sensing transistor M3 may include a source electrode (e.g., a source region) and a drain electrode (e.g., a drain region).

A source electrode (e.g., a source region) of the driving transistor M1 may be connected to a driving voltage line VDL configured to supply the driving power supply voltage ELVDD, and a drain electrode (e.g., a drain region) of the driving transistor M1 may be connected to the first electrode (e.g., the anode) of the light-emitting diode LED. A gate electrode of the driving transistor M1 may be connected to a first node N1. The driving transistor M1 may be configured to control the amount of current flowing through the light-emitting diode LED from the driving power supply voltage ELVDD in response to the voltage of the first node N1. However, the position of the source electrode (e.g., the source region) of the driving transistor M1 and the position of the drain electrode (e.g., the drain region) of the driving transistor M1 may be interchanged (e.g., may be switched with each other).

The switching transistor M2 may be a transistor for performing a switching operation. A source electrode (e.g., a source region) of the switching transistor M2 may be connected to a data line DL, and a drain electrode (e.g., a drain region) of the switching transistor M2 may be connected to the first node N1. A gate electrode of the switching transistor M2 may be connected to a scan line SL. The switching transistor M2 may be configured to be turned on when a scan signal is supplied to the scan line SL, to electrically connect the data line DL and the first node N1 to each other. However, the position of the source electrode (e.g., the source region) of the switching transistor M2 and the position of the drain electrode (e.g., the drain region) of the switching transistor M2 may be interchanged (e.g., may be switched with each other).

The sensing transistor M3 may be a transistor for initialization and/or a transistor for sensing. A drain electrode (e.g., a drain region) of the sensing transistor M3 may be connected to a second node N2, and a source electrode (e.g., a source region) of the sensing transistor M3 may be connected to a sensing line SEL. A gate electrode of the sensing transistor M3 may be connected to a control line CL. However, the position of the source electrode (e.g., the source region) of the sensing transistor M3 and the position of the drain electrode (e.g., the drain region) of the sensing transistor M3 may be interchanged (e.g., may be switched with each other).

The storage capacitor Cst may be connected between the first node N1 and the second node N2. For example, a first capacitor electrode of the storage capacitor Cst may be connected to the gate electrode of the driving transistor M1 (e.g., via the first node N1), and a second capacitor electrode of the storage capacitor Cst may be connected to the first electrode (e.g., the anode) of the light-emitting diode LED (e.g., via the second node N2).

Although FIG. 4 illustrates an example in which the driving transistor M1, the switching transistor M2, and the sensing transistor M3 are NMOS transistors, the present disclosure is not limited thereto. For example, at least one of the driving transistor M1, the switching transistor M2, and the sensing transistor M3 may be a PMOS transistor.

Although three transistors are illustrated in FIG. 4, the present disclosure is not limited thereto. In other embodiments, the pixel circuit PC may include four or more transistors.

Figure 5:
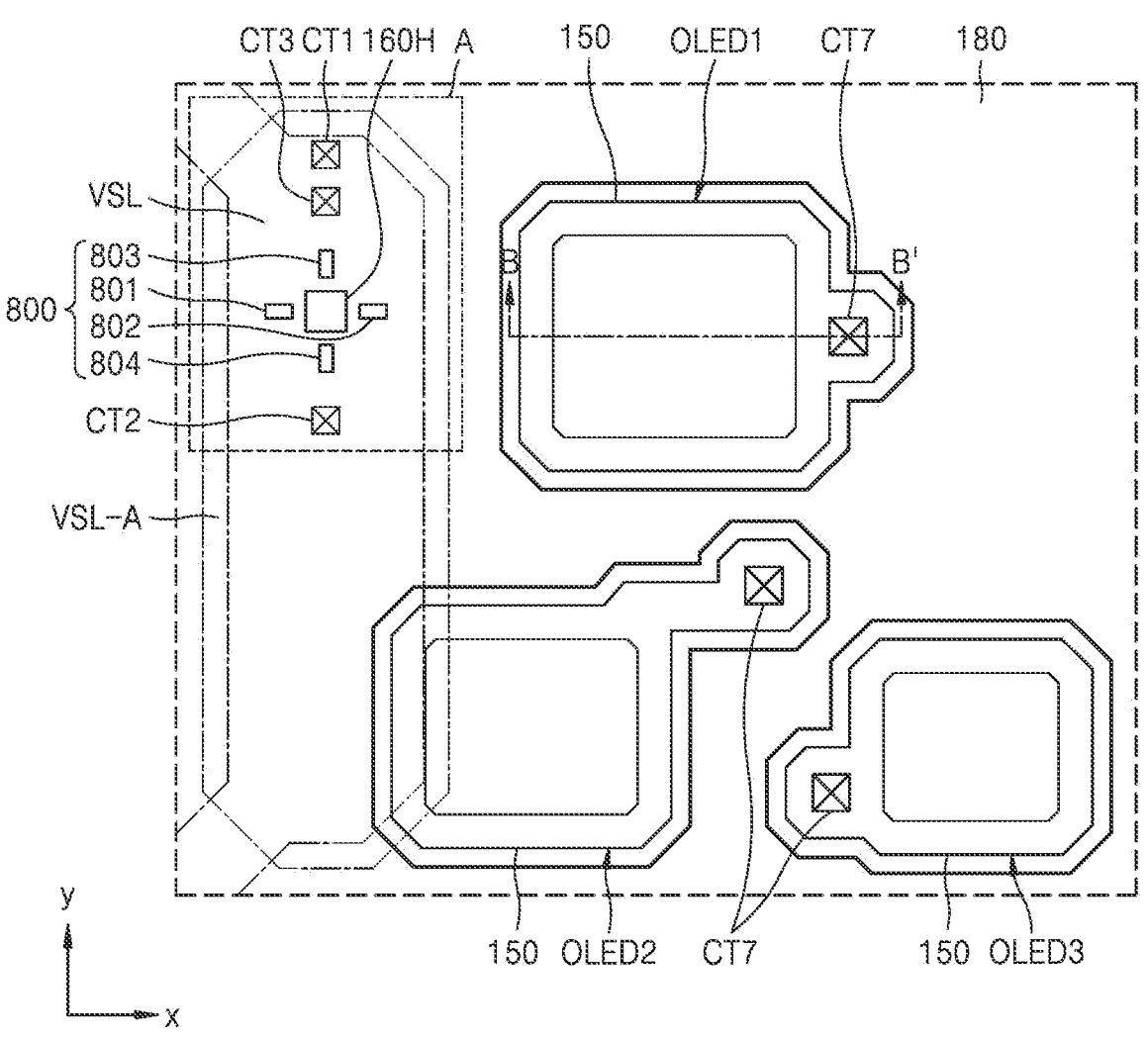
FIG. 5 is a plan view illustrating light-emitting diodes and wiring lines therearound in a display apparatus according to an embodiment.

FIG. 5 is a plan view illustrating light-emitting diodes and wiring lines therearound in a display apparatus according to an embodiment.

Referring to FIG. 5, a common voltage line VSL, an auxiliary common voltage line VSL-A, an auxiliary electrode 180, and a first electrode 150 may be arranged at (e.g., in or on) the display area DA.

In an embodiment, the auxiliary electrode 180 may at least partially overlap with the common voltage line VSL and the auxiliary common voltage line VSL-A. The auxiliary common voltage line VSL-A may be electrically connected to the common voltage line VSL through a first contact hole CT1, and may be electrically connected to the auxiliary electrode 180 through a second contact hole CT2. In addition, a second electrode 170 (e.g., refer to FIG. 8) of each of first to third organic light-emitting diodes OLED1, OLED2, and OLED3 may be electrically connected to the auxiliary electrode 180 through a hole 160H defined in (e.g., penetrating) an intermediate layer 160. Accordingly, the second electrode 170 may receive power (e.g., the common power supply voltage ELVSS) from the common voltage line VSL and/or the auxiliary common voltage line VSL-A. This will be described in more detail below with reference to FIGS. 7A and 8.

Also, the auxiliary common voltage line VSL-A may be electrically connected to a conductive layer 104 (e.g., refer to FIG. 8) through a third contact hole CT3. Because the auxiliary common voltage line VSL-A and the conductive layer 104 are electrically connected to each other through the third contact hole CT3, a resistance of the common voltage line VSL and the auxiliary common voltage line VSL-A may be reduced.

Intaglio patterns 800 may be formed at (e.g., in or on) the auxiliary electrode 180. The intaglio patterns 800 may include a first intaglio pattern 801, a second intaglio pattern 802, a third intaglio pattern 803, and a fourth intaglio pattern 804. Although FIG. 5 illustrates that four intaglio patterns 800 are formed, the present disclosure is not limited thereto.

Figure 8:
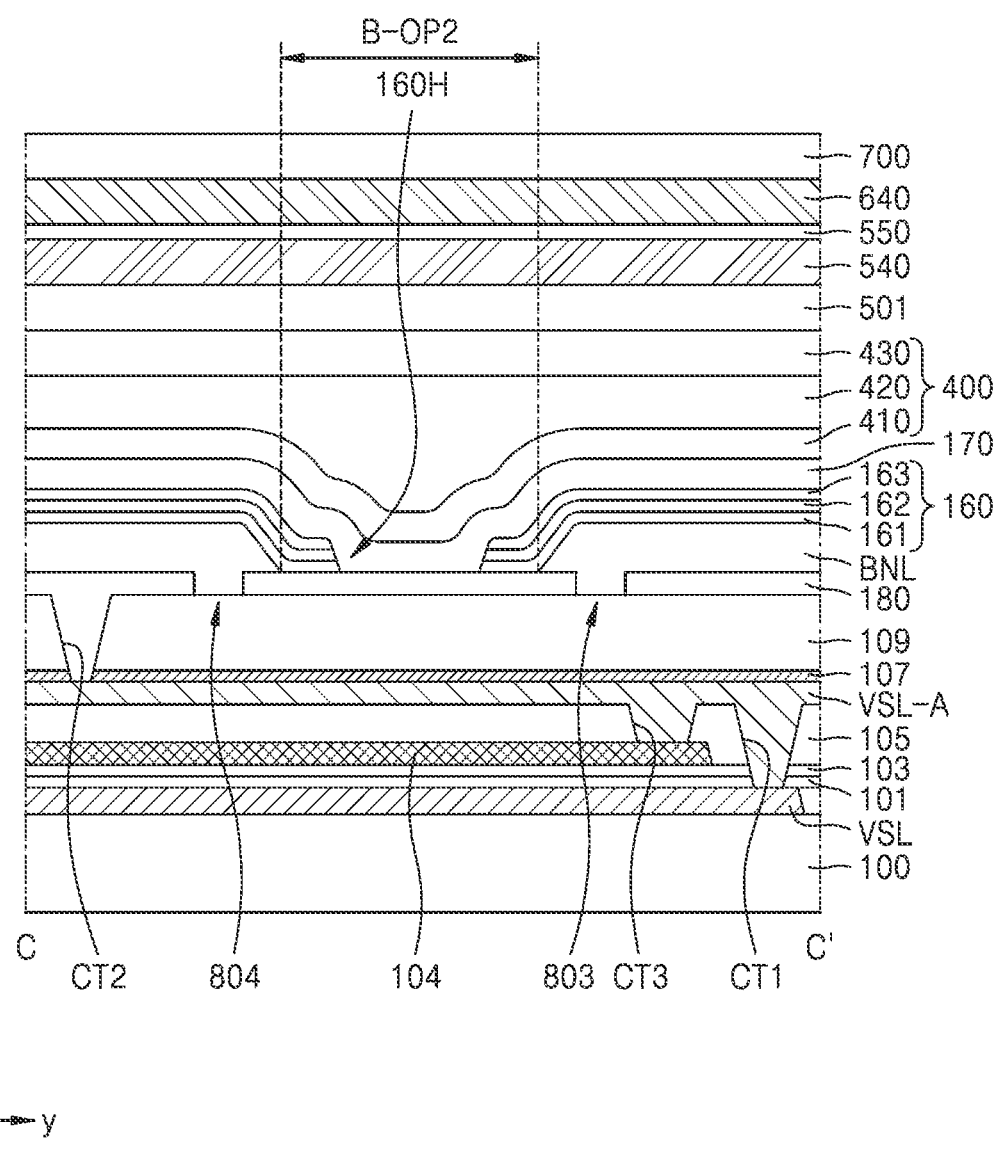
FIG. 8 is a cross-sectional view of the display apparatus taken along the line C-C' in FIG. 7A.

The intaglio patterns 800 may be concurrently (e.g., simultaneously or substantially simultaneously) formed when the auxiliary electrode 180 and the first electrode 150 are formed, and then may be used to calculate (e.g., to determine) a laser beam irradiation point DP (e.g., refer to FIG. 15B) for forming the hole 160H defined in the intermediate layer 160 (e.g., refer to FIG. 8).

The first electrode 150 of each of the light-emitting diodes, for example, the first to third organic light-emitting diodes OLED1, OLED2, and OLED3, may be electrically connected to a pixel circuit disposed thereunder through a seventh contact hole CT7. The pixel circuit connected to each of the first to third organic light-emitting diodes OLED1, OLED2, and OLED3 may include the plurality of transistors and the storage capacitor, as described above with reference to FIG. 4.

Figure 6:
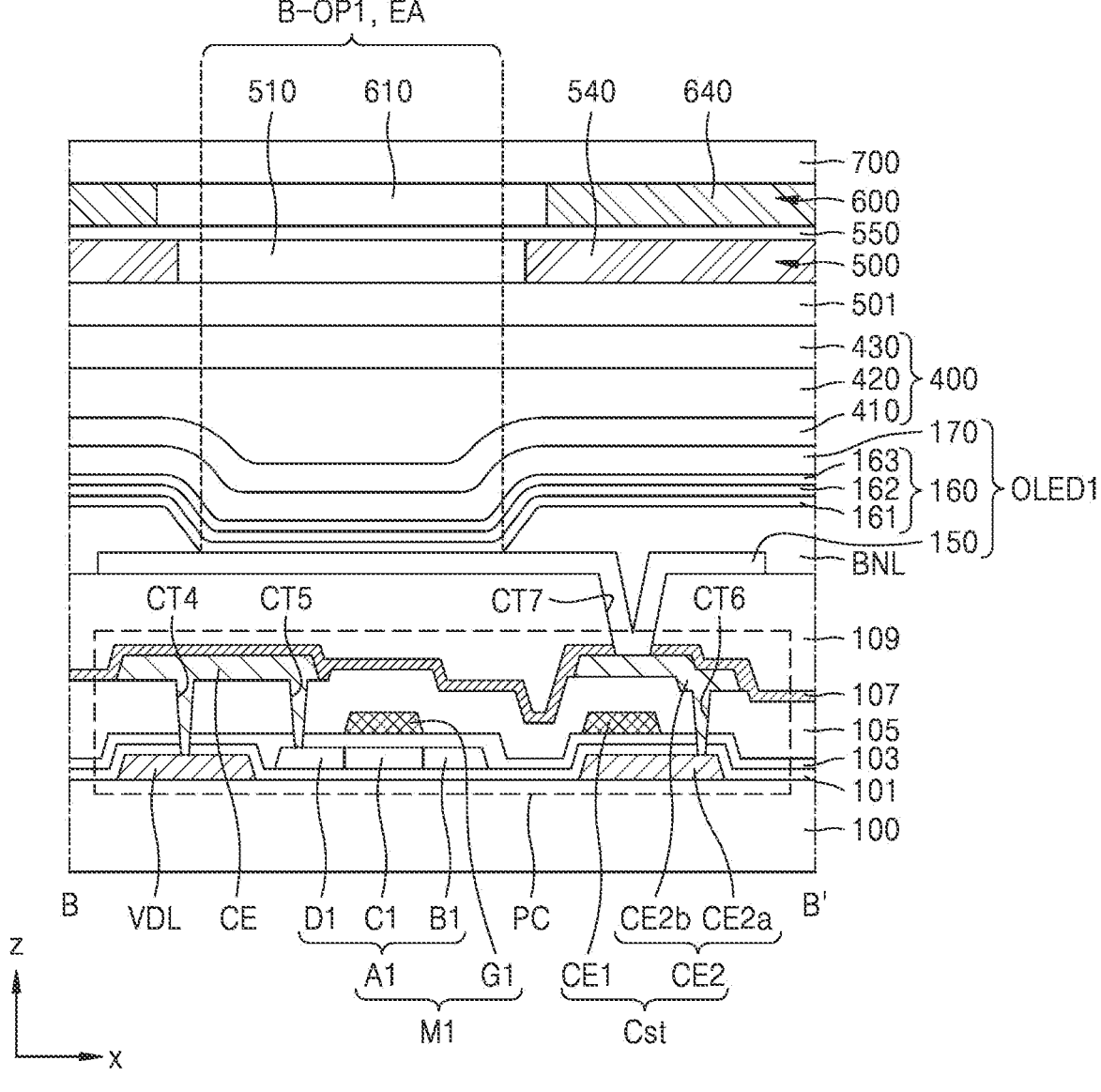
FIG. 6 is a cross-sectional view of the display apparatus taken along the line B-B' in FIG. 5.

FIG. 6 is a schematic cross-sectional view of the display apparatus taken along the line B-B' in FIG. 5.

Referring to FIG. 6, a light-emitting diode, for example, such as a first organic light-emitting diode OLED1, may be disposed on a substrate 100, and a pixel circuit PC may be located between the substrate 100 and the first organic light-emitting diode OLED1. In this regard, FIG. 6 illustrates the driving transistor M1 and the storage capacitor Cst, which are included in the pixel circuit PC. A second organic light-emitting diode OLED2 and a pixel circuit connected thereto, and a third organic light-emitting diode OLED3 and a pixel circuit connected thereto may have the same or substantially the same structure as that of the first organic light-emitting diode OLED1 and the pixel circuit PC shown in FIG. 6, and thus, redundant description thereof may not be repeated.

The substrate 100 may include a suitable material, such as a glass material, a metal material, or an organic material. For example, the substrate 100 may include a glass material containing $SiO_2$ as a main component, or may include various suitable materials having flexible and/or bendable properties, for example, such as a polymer resin.

The driving transistor M1 may include a semiconductor layer A1 and a gate electrode G1. The semiconductor layer A1 may include an oxide-based material or a silicon-based material (e.g., amorphous silicon or polysilicon). For example, the semiconductor layer A1 may include an oxide of at least one material selected from the group including indium (In), gallium (Ga), stanium (Sn), zirconium (Zr), vanadium (V), hafnium (Hf), cadmium (Cd), germanium (Ge), chromium (Cr), titanium (Ti), and/or zinc (Zn).

The semiconductor layer A1 may include a channel region Cl, and first and second low-resistance regions B1 and D1 disposed at (e.g., in or on) opposite sides with the channel region Cl therebetween. The first and second low-resistance regions B1 and D1 may be regions having a lower resistance than that of the channel region C1. One of the first and second low-resistance regions B1 and D1 may be a source region, and the other may be a drain region.

The semiconductor layer A1 may be located on a first insulating layer 101. The first insulating layer 101 may prevent or substantially prevent impurities from penetrating into the semiconductor layer A1. The first insulating layer 101 may include an inorganic insulating material, such as silicon nitride, silicon oxide, and/or silicon oxynitride.

A second insulating layer 103 may be between the semiconductor layer A1 and the gate electrode G1. The second insulating layer 103 may be a kind of gate insulating layer, and may include an inorganic insulating material, such as silicon nitride, silicon oxide, and/or silicon oxynitride.

The gate electrode G1 may overlap with the channel region Cl of the semiconductor layer A1. The gate electrode G1 may include molybdenum (Mo), copper (Cu), titanium (Ti), or the like, and may have a single-layer structure or a multi-layered structure including one or more of the aforementioned materials.

One of the first and second low resistance regions B1 and D1 of the semiconductor layer A1 may be electrically connected to a driving voltage line VDL. The driving voltage line VDL may be located between the substrate 100 and the first insulating layer 101. In other words, the driving voltage line VDL may be disposed under (e.g., underneath) the first insulating layer 101. The driving voltage line VDL may be connected to the second low resistance region D1 through a connection electrode CE disposed on a third insulating layer 105.

The driving voltage line VDL may include a metal material, such as Mo, Cu, or Ti. For example, the driving voltage line VDL may have a structure in which a titanium layer (e.g., a lower layer), and a copper layer (e.g., an upper layer) having a thickness (e.g., in the z-axis direction) greater than that of the titanium layer are stacked. As another example, the driving voltage line VDL may have a multi-layered structure including one or more metal layers including one or more of the aforementioned metal materials, and a transparent conductive oxide layer, such as an indium tin oxide (ITO) layer, disposed on the one or more metal layers. The third insulating layer 105 may include an inorganic insulating material, such as silicon nitride, silicon oxide, and/or silicon oxynitride.

When the second low-resistance region D1 is a source region (or a drain region), the connection electrode CE may be a source electrode (or a drain electrode) of the driving transistor M1, and when the second low-resistance region D1 is a drain region (or a source region), the connection electrode CE may be a drain electrode (or a source electrode) of the driving transistor M1. One end of the connection electrode CE may be connected to the driving voltage line VDL through a fourth contact hole CT4 passing (e.g., penetrating) through the first to third insulating layers 101, 103, and 105, and the other end of the connection electrode CE may be connected to a portion (e.g., the second low-resistance region D1) of the semiconductor layer A1 of the driving transistor M1 through a fifth contact hole CT5 passing (e.g., penetrating) through the second and third insulating layers 103 and 105. The connection electrode CE may include a metal material, such as Mo, Cu, or Ti. For example, the connection electrode CE may have a multi-layered structure including a titanium layer and a copper layer. As another example, the connection electrode CE may have a multi-layered structure including one or more metal layers including one or more of the aforementioned metal materials, and a transparent conductive oxide layer, such as an ITO layer, disposed on the one or more metal layers.

The storage capacitor Cst may include a first capacitor electrode CE1, and a second capacitor electrode CE2 overlapping with the first capacitor electrode CE1, with at least one insulating layer therebetween. The first capacitor electrode CE1 may be formed at (e.g., in or on) the same layer as that of the gate electrode G1, and may include the same material as that of the gate electrode G1. The first capacitor electrode CE1 may include Mo, Cu, Ti, or the like, and may have a single-layer structure or a multi-layered structure including one or more of the aforementioned materials.

In an embodiment, the second capacitor electrode CE2 may include two sub-capacitor electrodes CE2a and CE2b disposed below and above the first capacitor electrode CE1. One of the sub-capacitor electrodes CE2a and CE2b (hereinafter, referred to as a first sub-capacitor electrode CE2a) may be disposed between the substrate 100 and the first insulating layer 101, and the other (hereinafter, referred to as a second sub-capacitor electrode CE2b) may be disposed on the third insulating layer 105.

Each of the first sub-capacitor electrode CE2a and the second sub-capacitor electrode CE2b may include Mo, Cu, Ti, or the like, and may have a single-layer structure or a multi-layered structure including one or more of the aforementioned materials. In an embodiment, the first sub-capacitor electrode CE2a may be disposed at (e.g., in or on) the same layer as that of the driving voltage line VDL, and may include the same material as that of the driving voltage line VDL.

The second sub-capacitor electrode CE2b may be connected to the first sub-capacitor electrode CE2a through a sixth contact hole CT6 passing (e.g., penetrating) through the first to third insulating layers 101, 103, and 105. A capacitance may be formed between the first sub-capacitor electrode CE2a and the first capacitor electrode CE1 overlapping with each other, with the first and second insulating layers 101 and 103 therebetween, and the third insulating layer 105 is formed. A capacitance may be formed between the first capacitor electrode CE1 and the second sub-capacitor electrode CE2b overlapping with each other, with the third insulating layer 105 therebetween. As such, as the second capacitor electrode CE2 includes a plurality of sub-capacitor electrodes, the capacitance of the storage capacitor Cst may be improved.

A fourth insulating layer 107 may be disposed on the pixel circuit PC. The fourth insulating layer 107 may include an inorganic insulating material, such as silicon nitride, silicon oxide, and/or silicon oxynitride. The fourth insulating layer 107 may prevent or substantially prevent a wiring line including a metal (e.g., such as copper) that may be damaged by an etchant from being exposed to an etching environment in a process of manufacturing the display apparatus.

An organic insulating layer 109 may be disposed on the fourth insulating layer 107, and may include an organic insulating material. The organic insulating layer 109 may include an organic insulating material, such as acrylic, benzocyclobutene (BCB), polyimide, or hexamethyldisiloxane (HMDSO).

A first electrode 150 of a light-emitting diode may be disposed on the organic insulating layer 109. For example, FIG. 6 illustrates that the first electrode 150 of the first organic light-emitting diode OLED1 is disposed on the organic insulating layer 109. In this case, the first electrode 150 may be an anode.

The first electrode 150 may be connected to the pixel circuit PC, for example, such as to the second sub-capacitor electrode CE2b of the storage capacitor Cst, through a seventh contact hole CT7 passing (e.g., penetrating) through the fourth insulating layer 107 and the organic insulating layer 109.

The first electrode 150 may include a transparent conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). As another example, the first electrode 150 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a suitable compound thereof. As another example, the first electrode 150 may further include a layer formed of ITO, IZO, ZnO, or $In_2O_3$ above/under the reflective layer. For example, the first electrode 150 may have a three-layered structure, in which an ITO layer, an Ag layer, and an ITO layer are sequentially stacked.

A bank layer BNL may cover an edge of the first electrode 150, and may include a first bank opening B-OP1 that overlaps with a central portion of the first electrode 150 (e.g., that exposes at least a portion of the first electrode 150). The bank layer BNL may include an organic insulating material, such as polyimide.

An intermediate layer 160 may contact the first electrode 150 through the first bank opening B-OP1 of the bank layer BNL. A structure in which the first electrode 150, the intermediate layer 160, and the second electrode 170 positioned in the first bank opening B-OP1 are stacked may emit light of a suitable color (e.g., a predetermined or certain color). The first bank opening B-OP1 of the bank layer BNL may correspond to an emission area EA from which light is emitted. For example, the size (or width) of the first bank opening B-OP1 of the bank layer BNL may correspond to the size (or width) of the emission area EA.

The intermediate layer 160 may include an emission layer 162. The emission layer 162 may include a high molecular weight organic material or a low molecular weight organic material that emits light of a suitable color (e.g., a predetermined or certain color). As described above with reference to FIG. 2, when the light-emitting diode layer 300 emits the blue light (e.g., the source light), the emission layer 162 may include a high molecular weight organic material or a low molecular weight organic material that emits the blue light.

In an embodiment, the intermediate layer 160 may include at least one functional layer positioned above or below the emission layer 162. For example, as shown in FIG. 6, the intermediate layer 160 may include a first functional layer 161 disposed under (e.g., underneath) the emission layer 162, and/or a second functional layer 163 disposed above the emission layer 162. The first functional layer 161 may be between the first electrode 150 and the emission layer 162, and the second functional layer 163 may be between the emission layer 162 and a second electrode 170 described in more detail below.

The first functional layer 161 may include a hole transport layer (HTL) and/or a hole injection layer (HIL). The second functional layer 163 may include an electron transport layer (ETL) and/or an electron injection layer (EIL).

The second electrode 170 may be disposed on the intermediate layer 160. The second electrode 170 may be, for example, a cathode. The second electrode 170 may include a conductive material having a low work function. For example, the second electrode 170 may include a (semi) transparent layer including Ag, Mg, A1, Pt, Pd, Au, Ni, Nd, Ir, Cr, lithium (Li), calcium (Ca), or a suitable alloy thereof. As another example, the second electrode 170 may further include a layer including ITO, IZO, ZnO, or $In_2O_3$ on the (semi) transparent layer including one or more of the aforementioned materials.

In an embodiment, an encapsulation layer 400 may be disposed on the second electrode 170. The encapsulation layer 400 may include at least one inorganic encapsulation layer, and at least one organic encapsulation layer. In an embodiment, the encapsulation layer 400 may include a first inorganic encapsulation layer 410, an organic encapsulation layer 420, and a second inorganic encapsulation layer 430. The organic encapsulation layer 420 may be disposed between the first inorganic encapsulation layer 410 and the second inorganic encapsulation layer 430.

Each of the first and second inorganic encapsulation layers 410 and 430 may include one or more inorganic insulating materials. The one or more inorganic insulating materials may include aluminum oxide, titanium oxide, tantalum oxide, hafnium oxide, zinc oxide, silicon oxide, silicon nitride, and/or silicon oxynitride.

The organic encapsulation layer 420 may include a polymer-based material. The polymer-based material may include an acrylic resin, an epoxy-based resin, polyimide, polyethylene, and/or the like. For example, the organic encapsulation layer 420 may include an acrylic resin, such as polymethyl methacrylate or polyacrylic acid. The organic encapsulation layer 420 may be formed by curing a monomer or applying a polymer.

An intermediate material layer 501 may be disposed on the encapsulation layer 400. The intermediate material layer 501 may include an inorganic insulating material and/or an organic insulating material. A color conversion-transmitting layer 500 may be located on the intermediate material layer 501. For example, FIG. 6 shows a light blocking portion 540 of the color conversion-transmitting layer 500, and a first color conversion portion 510 positioned in an opening area defined by the light blocking portion 540.

A barrier layer 550 may be formed on the color conversion-transmitting layer 500. The barrier layer 550 may include an inorganic insulating material, such as silicon oxide, silicon nitride, and/or silicon oxynitride.

A color layer 600 may be disposed on the color conversion-transmitting layer 500. For example, FIG. 6 shows a light blocking portion 640 of the color layer 600, and a first color filter 610 positioned in an opening area defined by the light blocking portion 640. The light blocking portion 540 (hereinafter, referred to as a first light blocking portion 540) of the color conversion-transmitting layer 500 and the light blocking portion 640 (hereinafter, referred to as a second light blocking portion 640) of the color layer 600 may be disposed to overlap with each other.

The first light blocking portion 540 and the second light blocking portion 640 may each include a light blocking material. For example, the first light blocking portion 540 and the second light blocking portion 640 may each include an organic material having a suitable color (e.g., a predetermined or certain color), such as black. For example, the first light blocking portion 540 and the second light blocking portion 640 may each include a polyimide (PI)-based binder, and a pigment in which red, green, and blue colors are mixed with each other. As another example, the first light blocking portion 540 and the second light blocking portion 640 may each include a cardo-based binder resin, and a mixture of lactam black pigment and blue pigment. As another example, the first light blocking portion 540 and the second light blocking portion 640 may each include carbon black.

In an embodiment, the first light blocking portion 540 and the second light blocking portion 640 may include the same or substantially the same material as each other. In another embodiment, the second light blocking portion 640 may have a structure in which at least two or more color filters forming the color layer 600 overlap with each other. For example, the second light blocking portion 640 may not include the light blocking material described above, and may have a structure in which two or more color filter selected from the first to third color filters 610, 620, and 630 (e.g., refer to FIG. 2) are stacked.

A light-transmitting base layer 700 may include glass or a light-transmitting organic material. For example, the light-transmitting base layer 700 may include the light-transmitting organic material, such as an acrylic resin.

Figure 7A:
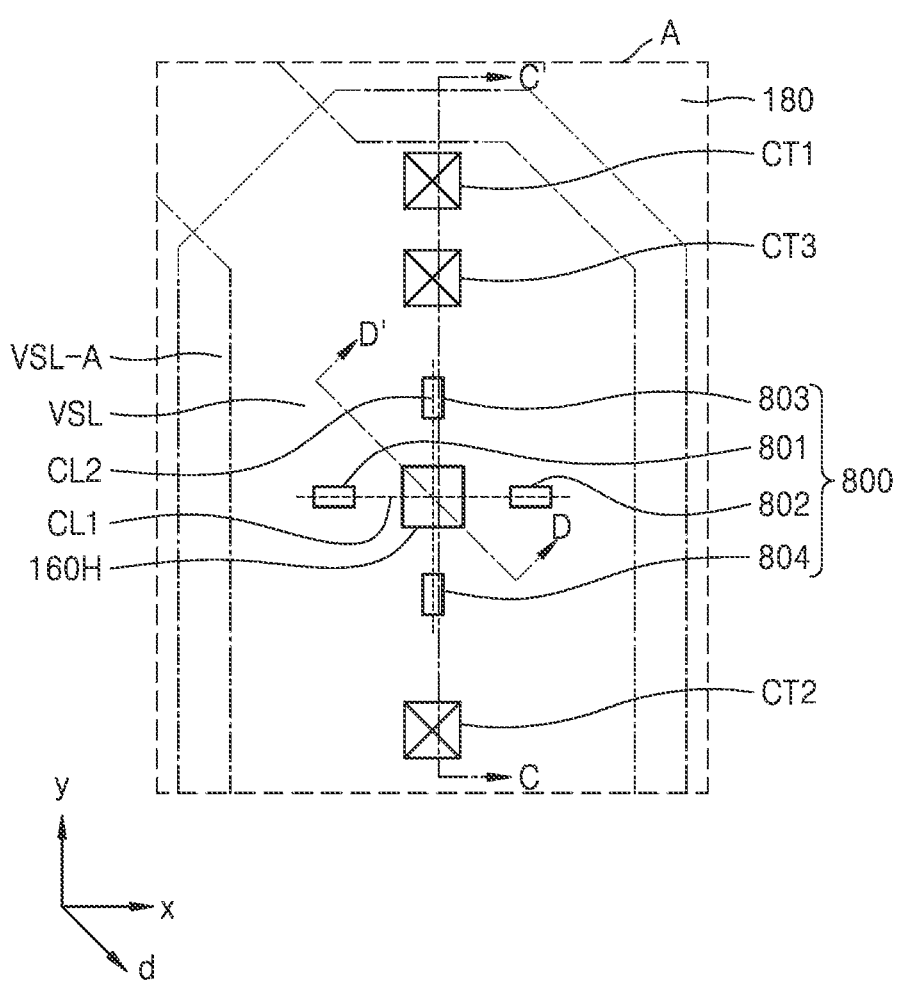
FIGS. 7A-7C are schematic plan views of a display apparatus according to one or more embodiments.
Figure 7B:
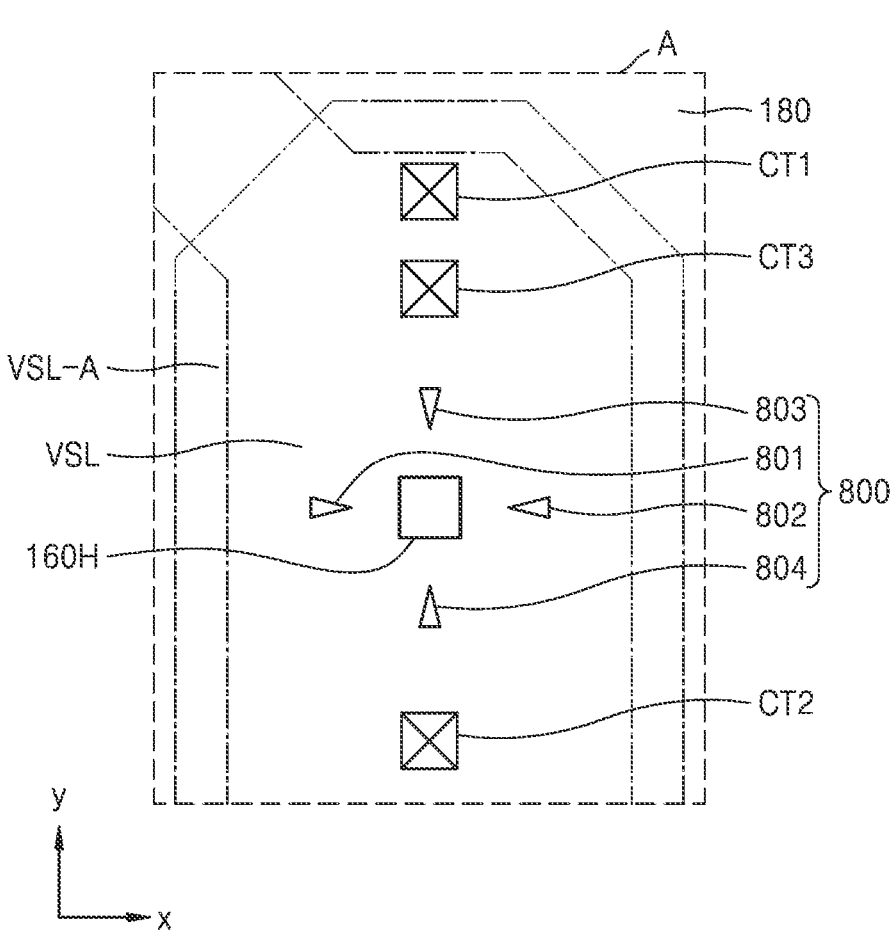
Figure 7C:
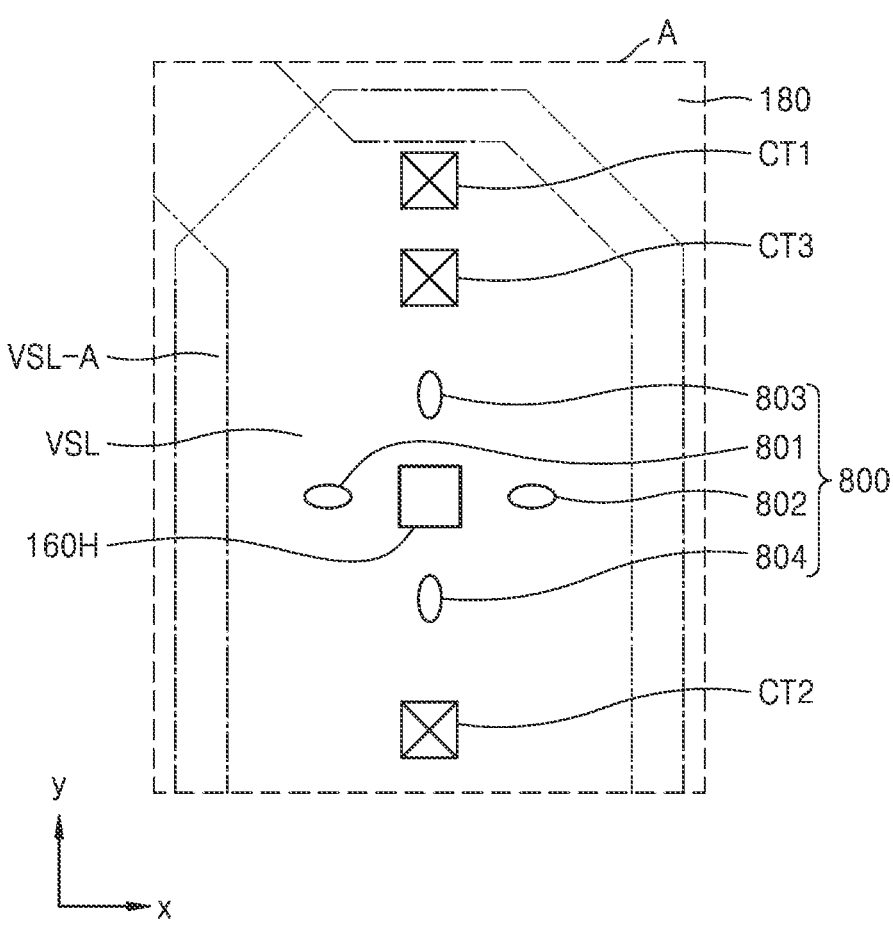
Figure 9:
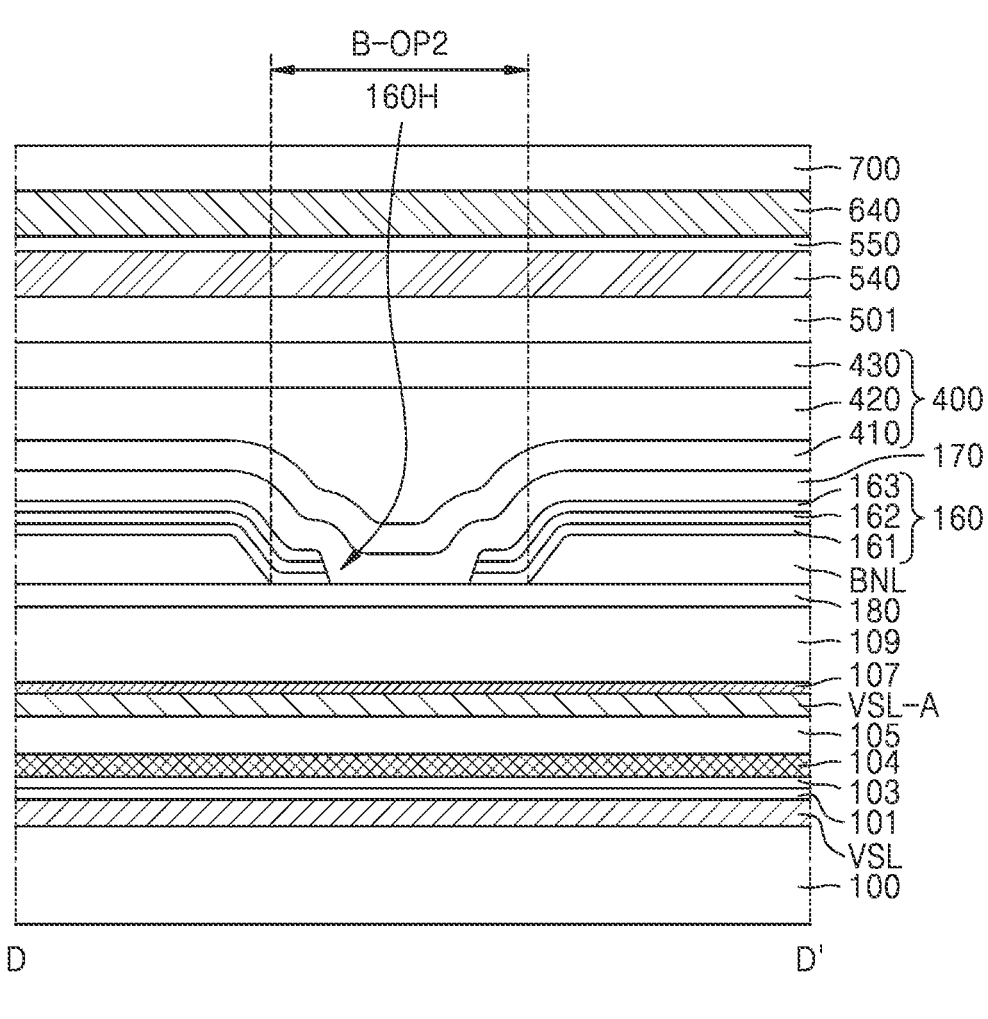
FIG. 9 is a cross-sectional view of the display apparatus taken along the line D-D' in FIG. 7A.

FIGS. 7A, 7B, and 7C are schematic plan views of a display apparatus according to one or more embodiments. In more detail, FIGS. 7A, 7B, and 7C are plan views illustrating various structures of a common voltage line and an auxiliary electrode of a display apparatus according to one or more embodiments, and may correspond to an enlarged plan view of the region A of FIG. 5. FIG. 8 is a cross-sectional view of the display apparatus taken along the line C-C' in FIG. 7A, and FIG. 9 is a cross-sectional view of the display apparatus taken along the line D-D' in FIG. 7A. In FIGS. 7A, 7B, 7C, 8, and 9, the same reference numerals are used to denote the same or substantially the same elements, members, and layers as those described above with reference to FIG. 5 and/or FIG. 6, and thus, redundant description thereof may not be repeated.

Referring to FIGS. 7A, 8, and 9, a common voltage line VSL, an auxiliary common voltage line VSL-A, and an auxiliary electrode 180 may be disposed on a substrate 100.

In an embodiment, the common voltage line VSL may be disposed on the substrate 100. The common voltage line VSL may be provided at (e.g., in or on) the same layer as that of the driving voltage line VDL described above with reference to FIG. 6, and may include the same material as that of the driving voltage line VDL. The common voltage line VSL may extend in a second direction (e.g., a y direction) crossing a first direction (e.g., an x direction).

In an embodiment, a first insulating layer 101 and a second insulating layer 103 may be disposed on the common voltage line VSL. A conductive layer 104 may be disposed on the second insulating layer 103. The conductive layer 104 may be provided at (e.g., in or on) the same layer as that of the gate electrode G1 described above with reference to FIG. 6, and may include the same material as that of the gate electrode G1. The conductive layer 104 may also extend in the second direction (e.g., the y direction).

In an embodiment, a third insulating layer 105 may be disposed on the conductive layer 104, and the auxiliary common voltage line VSL-A may be disposed on the third insulating layer 105. The auxiliary common voltage line VSL-A may be provided at (e.g., in or on) the same layer as that of the connection electrode CE described above with reference to FIG. 6, and may include the same material as that of the connection electrode CE. The auxiliary common voltage line VSL-A may extend in the second direction (e.g., the y direction).

In an embodiment, the auxiliary common voltage line VSL-A may be electrically connected to the common voltage line VSL through a first contact hole CT1 defined in (e.g., penetrating) the first insulating layer 101, the second insulating layer 103, and the third insulating layer 105. Also, the auxiliary common voltage line VSL-A may be electrically connected to the conductive layer 104 through a third contact hole CT3 defined in (e.g., penetrating) the third insulating layer 105.

In an embodiment, a width (e.g., in the x direction) of the common voltage line VSL may be different from the width of the auxiliary common voltage line VSL-A. For example, the width of the common voltage line VSL may be smaller than the width of the auxiliary common voltage line VSL-A. However, the present disclosure is not limited thereto. The width of the common voltage line VSL may be larger than or equal to the width of the auxiliary common voltage line VSL-A.

In an embodiment, a fourth insulating layer 107 may be disposed on the auxiliary common voltage line VSL-A. The fourth insulating layer 107 may be directly disposed on the auxiliary common voltage line VSL-A. The fourth insulating layer 107 may serve to protect the auxiliary common voltage line VSL-A.

An organic insulating layer 109 may be disposed on the fourth insulating layer 107, and an auxiliary electrode 180 may be disposed on the organic insulating layer 109. The auxiliary electrode 180 may overlap with the common voltage line VSL and/or the auxiliary common voltage line VSL-A.

A portion of the auxiliary electrode 180 may be connected to any one of the common voltage line VSL or the auxiliary common voltage line VSL-A that have the same or substantially same voltage level as each other. For example, a portion of the auxiliary electrode 180 may be connected to the auxiliary common voltage line VSL-A through a second contact hole CT2 defined in (e.g., penetrating) the fourth insulating layer 107 and the organic insulating layer 109. In addition, a portion of the auxiliary common voltage line VSL-A may be connected to the common voltage line VSL through the first contact hole CT1 defined in (e.g., penetrating) the first insulating layer 101, the second insulating layer 103, and the third insulating layer 105.

In an embodiment, the auxiliary electrode 180 may have a relatively large area. In an embodiment, the area of the auxiliary electrode 180 may be greater than that of the common voltage line VSL and/or that of the auxiliary common voltage line VSL-A, the common voltage line VSL and the auxiliary common voltage line VSL-A being disposed under (e.g., underneath) the auxiliary electrode 180. However, the present disclosure is not limited thereto.

In an embodiment, the auxiliary electrode 180 may be provided at (e.g., in or on) the same layer as that of the first electrode 150 (e.g., refer to FIG. 6) of the light-emitting diode, and may include the same material as that of the first electrode 150. For example, the auxiliary electrode 180 may include a structure in which an ITO layer, an Ag layer, and an ITO layer are sequentially stacked.

In an embodiment, intaglio patterns 800 may be formed in the auxiliary electrode 180. The intaglio patterns 800 formed in the auxiliary electrode 180 may be formed concurrently (e.g., simultaneously or substantially simultaneously) with the auxiliary electrode 180 when the auxiliary electrode 180 is formed. For example, the intaglio patterns 800 may correspond to portions from which a material (e.g., a conductive material layer 150M in FIG. 11) forming the auxiliary electrode 180 is removed. As described above, the intaglio patterns 800 may include a first intaglio pattern 801, a second intaglio pattern 802, a third intaglio pattern 803, and a fourth intaglio pattern 804. The first intaglio pattern 801, the second intaglio pattern 802, the third intaglio pattern 803, and the fourth intaglio pattern 804 may be formed around (e.g., adjacent to) the hole 160H defined in the intermediate layer 160 described in more detail below. In other words, the first intaglio pattern 801, the second intaglio pattern 802, the third intaglio pattern 803, and the fourth intaglio pattern 804 may be formed around (e.g., adjacent to) the hole 160H defined in the intermediate layer 160.

In an embodiment, the first intaglio pattern 801 and the second intaglio pattern 802 may be spaced apart from each other in the first direction (e.g., the x direction) with respect to the hole 160H defined in the intermediate layer 160. The first intaglio pattern 801 and the second intaglio pattern 802 may be disposed on the left and right sides (e.g., the left and right ends), respectively, of an imaginary line (e.g., a first imaginary line CL1) extending in the first direction (e.g., the x direction) with respect to the hole 160H defined in the intermediate layer 160.

In an embodiment, the third intaglio pattern 803 and the fourth intaglio pattern 804 may be spaced apart from each other in the second direction (e.g., the y direction) with respect to the hole 160H defined in the intermediate layer 160, the second direction (e.g., the y direction) crossing the first direction (e.g., the x direction). The third intaglio pattern 803 and the fourth intaglio pattern 804 may be disposed on the upper side and the lower side (e.g., the upper and lower ends), respectively, of an imaginary line (e.g., a second imaginary line CL2) extending in the second direction (e.g., the y direction) with respect to the hole 160H defined in the intermediate layer 160.

In some embodiments, the first intaglio pattern 801 and the second intaglio pattern 802 may be symmetrically or substantially symmetrically arranged with each other relative to the second imaginary line CL2, and the third intaglio pattern 803 and the fourth intaglio pattern 804 may be symmetrically or substantially symmetrically arranged with each other relative to the first imaginary line CL1, but the present disclosure is not limited thereto.

As shown in FIG. 7A, each of the first to fourth intaglio patterns 801, 802, 803, and 804 may have a rectangular shape on a plane (e.g., in a plan view). As another example, as shown in FIG. 7B, each of the first to fourth intaglio patterns 801, 802, 803, and 804 may have a triangular shape on a plane (e.g., in a plan view). As another example, as shown in FIG. 7C, each of the first to fourth intaglio patterns 801, 802, 803, and 804 may have an oval shape on a plane (e.g., in a plan view). As another example, each of the first to fourth intaglio patterns 801, 802, 803, and 804 may have another suitable polygonal shape on a plane (e.g., in a plan view). However, the present disclosure is not limited thereto.

In an embodiment, a bank layer BNL may be disposed on the auxiliary electrode 180. An opening (hereinafter, referred to as a second bank opening B-OP2) exposing at least a portion of the auxiliary electrode 180 may be defined in (e.g., may penetrate) the bank layer BNL. A portion of the auxiliary electrode 180 may be exposed through the second bank opening B-OP2 defined in the bank layer BNL.

In an embodiment, the intermediate layer 160 including the first functional layer 161, the emission layer 162, and the second functional layer 163 may be disposed on the bank layer BNL. The hole 160H exposing at least a portion of the auxiliary electrode 180 may be defined in (e.g., may penetrate) the intermediate layer 160. The hole 160H defined in the intermediate layer 160 may overlap with the second bank opening B-OP2 of the bank layer BNL. The hole 160H defined in the intermediate layer 160 may entirely overlap with the second bank opening B-OP2. For example, the hole 160H defined in the intermediate layer 160 may be located in the second bank opening B-OP2 of the bank layer BNL.

In a plan view, the hole 160H defined in the intermediate layer 160 may be located at a point where the first imaginary line CL1 passing through the first intaglio pattern 801 and the second intaglio pattern 802 formed at (e.g., in or on) the auxiliary electrode 180 meets (e.g., crosses or intersects) the second imaginary line CL2 passing through the third intaglio pattern 803 and the fourth intaglio pattern 804 formed at (e.g., in or on) the auxiliary electrode 180. In this case, the first imaginary line CL1 may be an imaginary line extending in the first direction (e.g., the x direction), and the second imaginary line CL2 may be an imaginary line extending in the second direction (e.g., the y direction). However, the present disclosure is not limited thereto. For example, in some embodiments, the first imaginary line CL1 may be an imaginary line extending in a direction that is diagonal to the first direction (e.g., the x direction) and/or the second direction (e.g., the y direction). The second imaginary line CL2 may be an imaginary line extending in a direction perpendicular to or substantially perpendicular to the first imaginary line CL1 extending in the diagonal direction.

In an embodiment, the second electrode 170 may be disposed on the intermediate layer 160. The second electrode 170 may be in direct contact with the auxiliary electrode 180 through the hole 160H defined in the intermediate layer 160. In other words, the second electrode 170 may be electrically connected to the auxiliary electrode 180 through the hole 160H defined in the intermediate layer 160. The common voltage line VSL may be connected to (e.g., electrically connected to) the auxiliary common voltage line VSL-A through the first contact hole CT1. The auxiliary common voltage line VSL-A may be connected to (e.g., electrically connected to) the auxiliary electrode 180 through the second contact hole CT2. The auxiliary electrode 180 may be connected to (e.g., electrically connected to) the second electrode 170 through the hole 160H defined in the intermediate layer 160. Accordingly, the second electrode 170 may be electrically connected to the common voltage line VSL and/or the auxiliary common voltage line VSL-A, and the common power supply voltage ELVSS may be provided to the second electrode 170 through the common voltage line VSL and/or the auxiliary common voltage line VSL-A.

As described above with reference to FIG. 6, the encapsulation layer 400, the intermediate material layer 501, the first light blocking portion 540, the barrier layer 550, the second light blocking portion 640, and the light-transmitting base layer 700 may be disposed on the second electrode 170.

Referring to FIG. 8, the third intaglio pattern 803 and the fourth intaglio pattern 804 positioned along the second direction (e.g., the y direction) of FIG. 7A may be formed on the auxiliary electrode 180. The intaglio patterns 800 do not pass through a cross-section taken along the line D-D' in FIG. 7A, and thus, there may be no intaglio patterns 800 in the portion of the auxiliary electrode 180 shown in FIG. 9.

FIGS. 10 through 16 are schematic cross-sectional views and plan views illustrating a method of manufacturing a display apparatus according to an embodiment. FIGS. 10, 11, 12A, 13, 14, 15A, and 16 are cross-sectional views of various processes of the method of manufacturing a display apparatus according to an embodiment, and illustrate cross-sections taken along the line B-B' in FIG. 5 and along the line C-C' in FIG. 7A. Hereinafter, sequential processes of the method of manufacturing a display apparatus will be described in more detail with reference to FIGS. 10 through 16.

Figure 10:
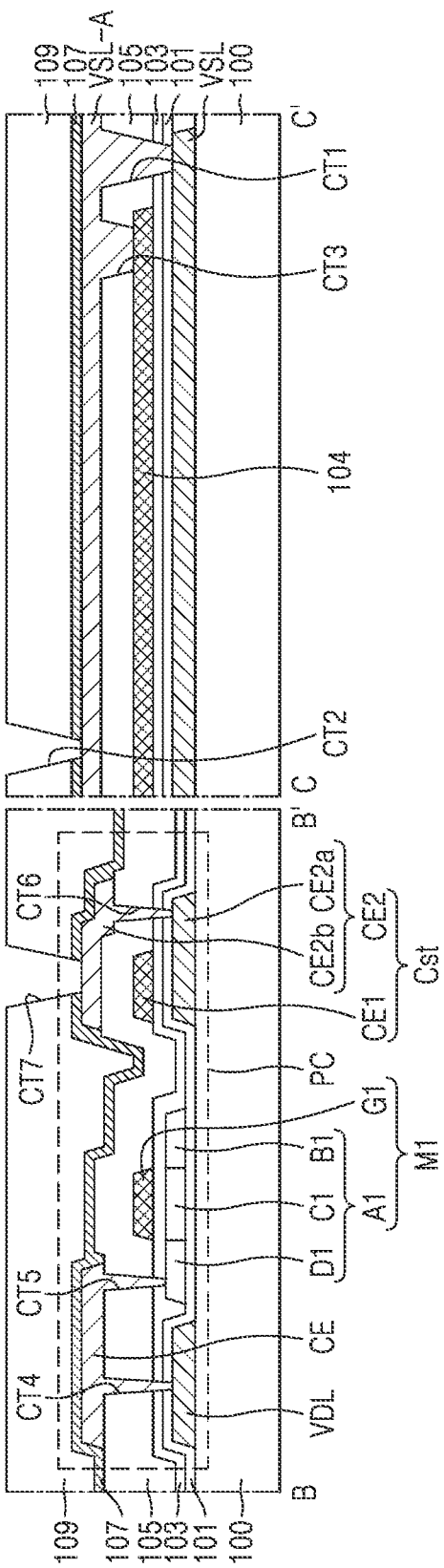
FIGS. 10-16 are schematic cross-sectional views and plan views illustrating a method of manufacturing a display apparatus according to an embodiment.

Referring to FIG. 10, in the cross-section taken along the line B-B' in FIG. 5, a pixel circuit PC, a first insulating layer 101, a second insulating layer 103, a third insulating layer 105, a fourth insulating layer 107, and an organic insulating layer 109 may be located on a substrate 100. A seventh contact hole CT7 may be defined (e.g., may penetrate) through the fourth insulating layer 107 and the organic insulating layer 109.

In the cross-section taken along the line C-C' in FIG. 7A, a common voltage line VSL, a conductive layer 104, an auxiliary common voltage line VSL-A, the first insulating layer 101, the second insulating layer 103, the third insulating layer 105, the fourth insulating layer 107, and the organic insulating layer 109 may be located on the substrate 100. The auxiliary common voltage line VSL-A may be electrically connected to the common voltage line VSL through a first contact hole CT1 defined in (e.g., penetrating the first to third insulating layers 101, 103, and 105. Also, the auxiliary common voltage line VSL-A may be electrically connected to the conductive layer 104 through a third contact hole CT3 defined in (e.g., penetrating) the third insulating layer 105. A second contact hole CT2 may be defined in (e.g., may penetrate) the fourth insulating layer 107 and the organic insulating layer 109.

Figure 11:
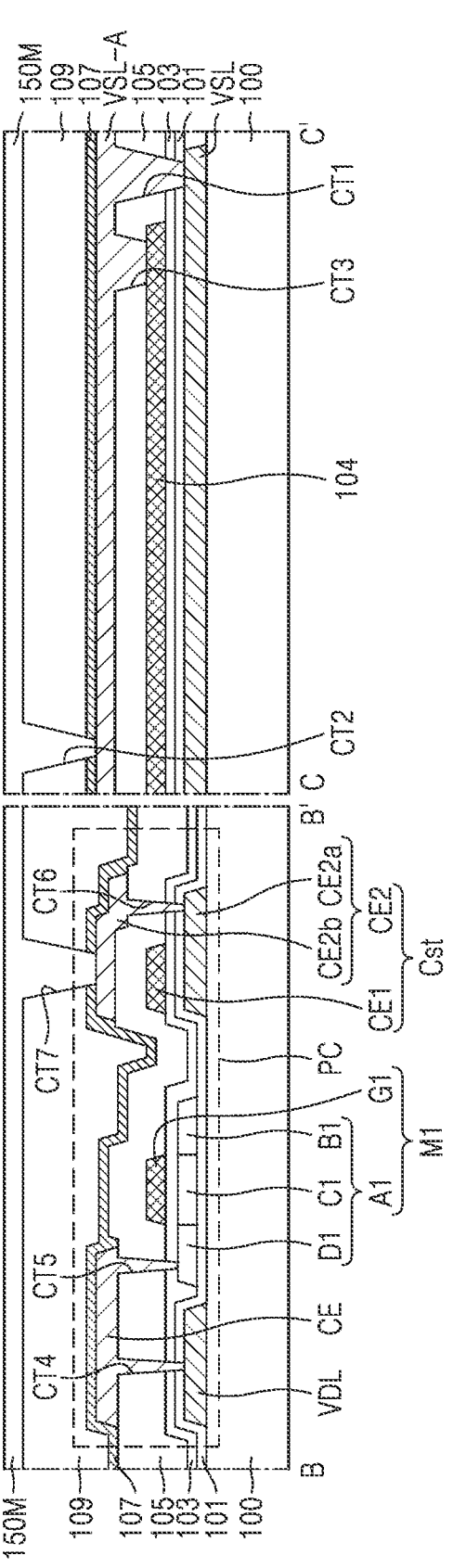

Referring to FIG. 11, after forming the organic insulating layer 109 on the substrate 100, a conductive material layer 150M may be formed on the organic insulating layer 109. The conductive material layer 150M may be entirely formed on the organic insulating layer 109. The conductive material layer 150M may include a transparent conductive oxide, such as ITO, IZO, ZnO, In$_2$O$_3$, IGO, or AZO. As another example, the conductive material layer 150M may include a reflective layer including Ag, Mg, A1, Pt, Pd, Au, Ni, Nd, Ir, Cr, or a suitable compound thereof. As another example, the conductive material layer 150M may further include a layer formed of ITO, IZO, ZnO, or In$_2$O$_3$ above/under the reflective layer. For example, the conductive material layer 150M may have a three-layered structure in which an ITO layer, an Ag layer, and an ITO layer are sequentially stacked.

Figure 12A:
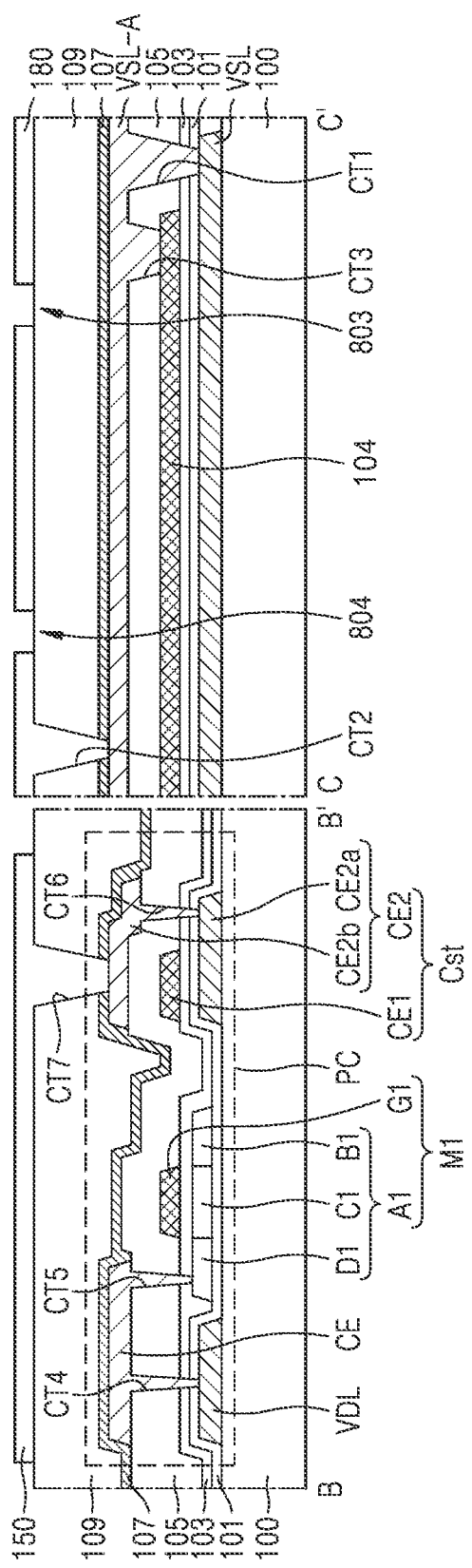
Figure 12B:
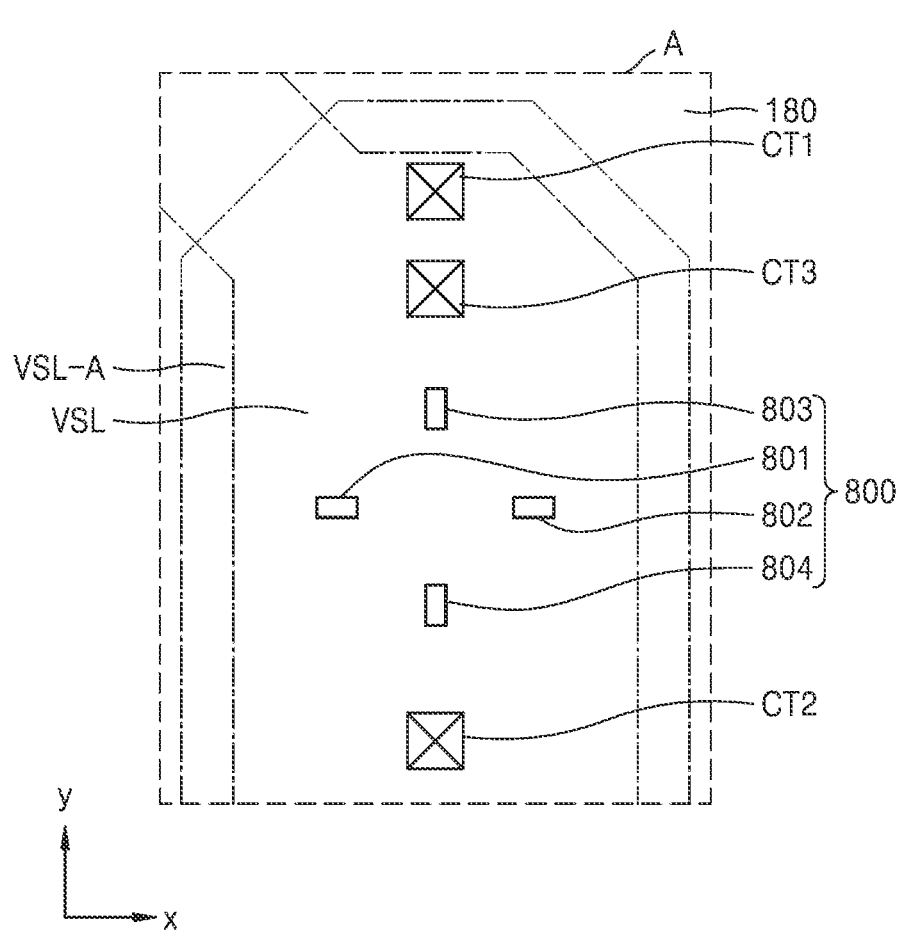

Referring to FIGS. 12A and 12B, after the forming of the conductive material layer 150M on the organic insulating layer 109, the conductive material layer 150M may be patterned to form a first electrode 150, an auxiliary electrode 180, and intaglio patterns 800.

In an embodiment, the first electrode 150 and the auxiliary electrode 180 may be formed by patterning the conductive material layer 150M. In this case, in the process of forming the first electrode 150 and the auxiliary electrode 180 by patterning the conductive material layer 150M, the intaglio patterns 800 may be formed concurrently (e.g., simultaneously or substantially simultaneously) with the first electrode 150 and the auxiliary electrode 180. The intaglio patterns 800 may be patterns formed by removing portions of the conductive material layer 150M. The intaglio patterns 800 may be surrounded (e.g., around peripheries thereof) by the auxiliary electrode 180. In other words, the intaglio patterns 800 may be defined by the auxiliary electrode 180. For example, the intaglio patterns 800 may be formed at (e.g., in or on) the auxiliary electrode 180. The intaglio patterns 800 may be holes (or openings) exposing at least a portion of an upper surface of the organic insulating layer 109 formed under (e.g., underneath) the auxiliary electrode 180.

The intaglio patterns 800 formed in the auxiliary electrode 180 may include the first intaglio pattern 801, the second intaglio pattern 802, the third intaglio pattern 803, and the fourth intaglio pattern 804. The first intaglio pattern 801 and the second intaglio pattern 802 may be spaced apart from each other in a first direction (e.g., an x direction). The third intaglio pattern 803 and the fourth intaglio pattern 804 may be spaced apart from each other in a second direction (e.g., a y direction) crossing the first direction (e.g., the x direction). Although FIG. 12B illustrates that four intaglio patterns 800 are formed, the present disclosure is not limited thereto.

In an embodiment, the shapes of the first to fourth intaglio patterns 801, 802, 803, and 804 on a plane (e.g., in a plan view) may be provided as various suitable polygons, including rectangles and triangles. As another example, each of the first to fourth intaglio patterns 801, 802, 803, and 804 may have an oval shape on a plane (e.g., in a plan view). However, the present disclosure is not limited thereto.

Figure 13:
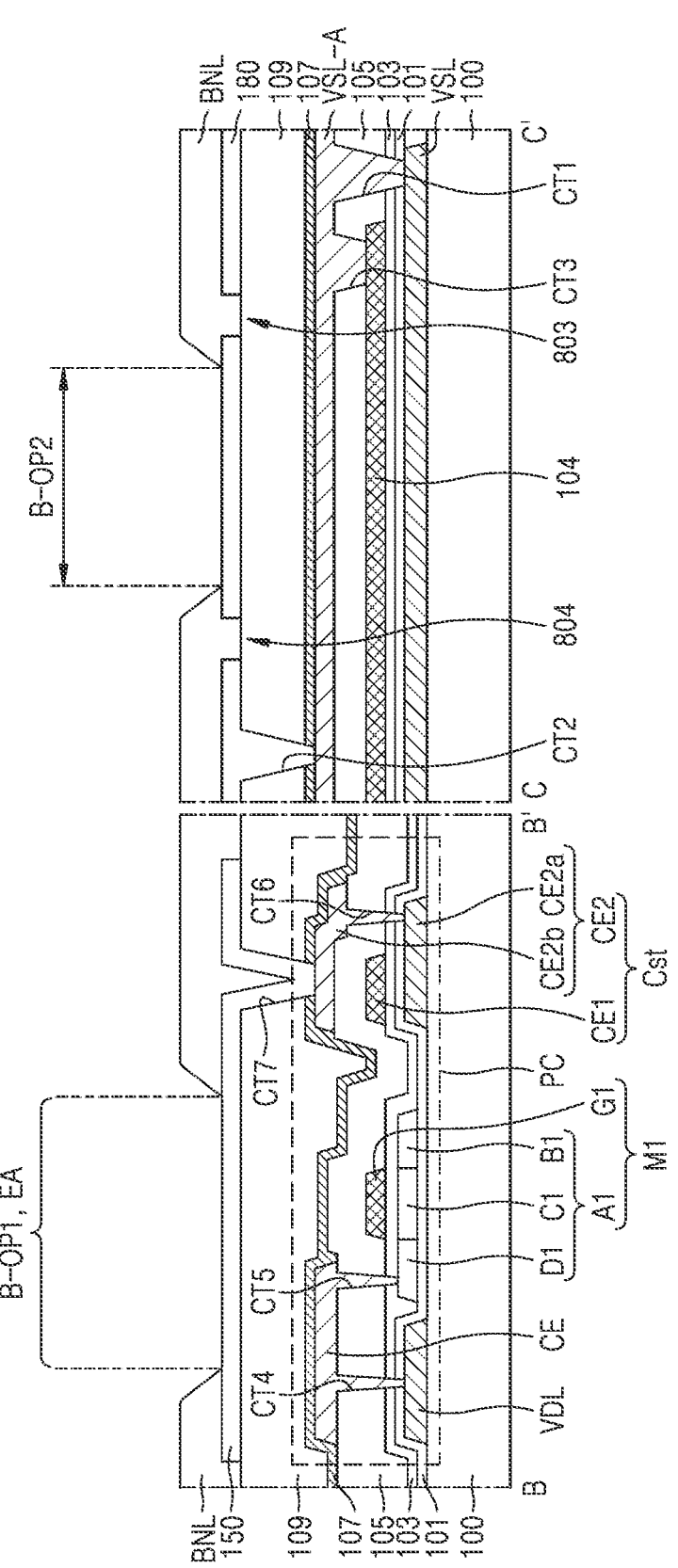

Referring to FIG. 13, after the patterning of the conductive material layer 150M to form the first electrode 150, the auxiliary electrode 180, and the intaglio patterns 800, a bank layer BNL, in which a first bank opening B-OP1 and a second bank opening B-OP2 are defined, may be formed on the first electrode 150, the auxiliary electrode 180, and the intaglio patterns 800.

In an embodiment, the first bank opening B-OP1 and the second bank opening B-OP2 may be defined in (e.g., may penetrate) the bank layer BNL. At least a portion of the first electrode 150 may be exposed through the first bank opening B-OP1 defined in the bank layer BNL, and at least a portion of the auxiliary electrode 180 may be exposed through the second bank opening B-OP2 defined in the bank layer BNL.

Figure 14:
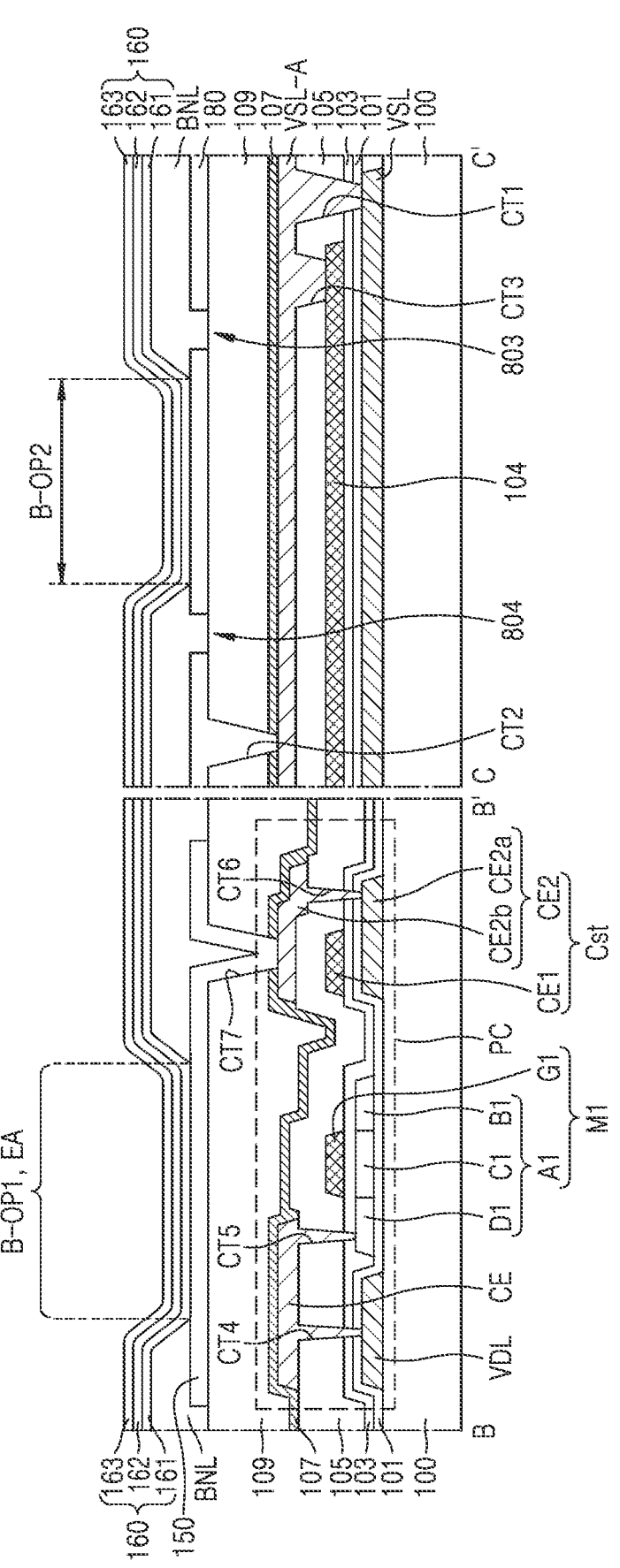

Referring to FIG. 14, after the forming of the bank layer BNL, in which the first bank opening B-OP1 and the second bank opening B-OP2 are defined, on the first electrode 150, the auxiliary electrode 180, and the intaglio patterns 800, an intermediate layer 160 may be formed on the first electrode 150, the auxiliary electrode 180, and the bank layer BNL.

In an embodiment, the intermediate layer 160 may be entirely formed on the first electrode 150 that is at least partially exposed by the first bank opening B-OP1, the auxiliary electrode 180 that is at least partially exposed through the second bank opening B-OP2, and the bank layer BNL. In this case, the intermediate layer 160 may include the first functional layer 161, the emission layer 162, and the second functional layer 163.

Figure 15A:
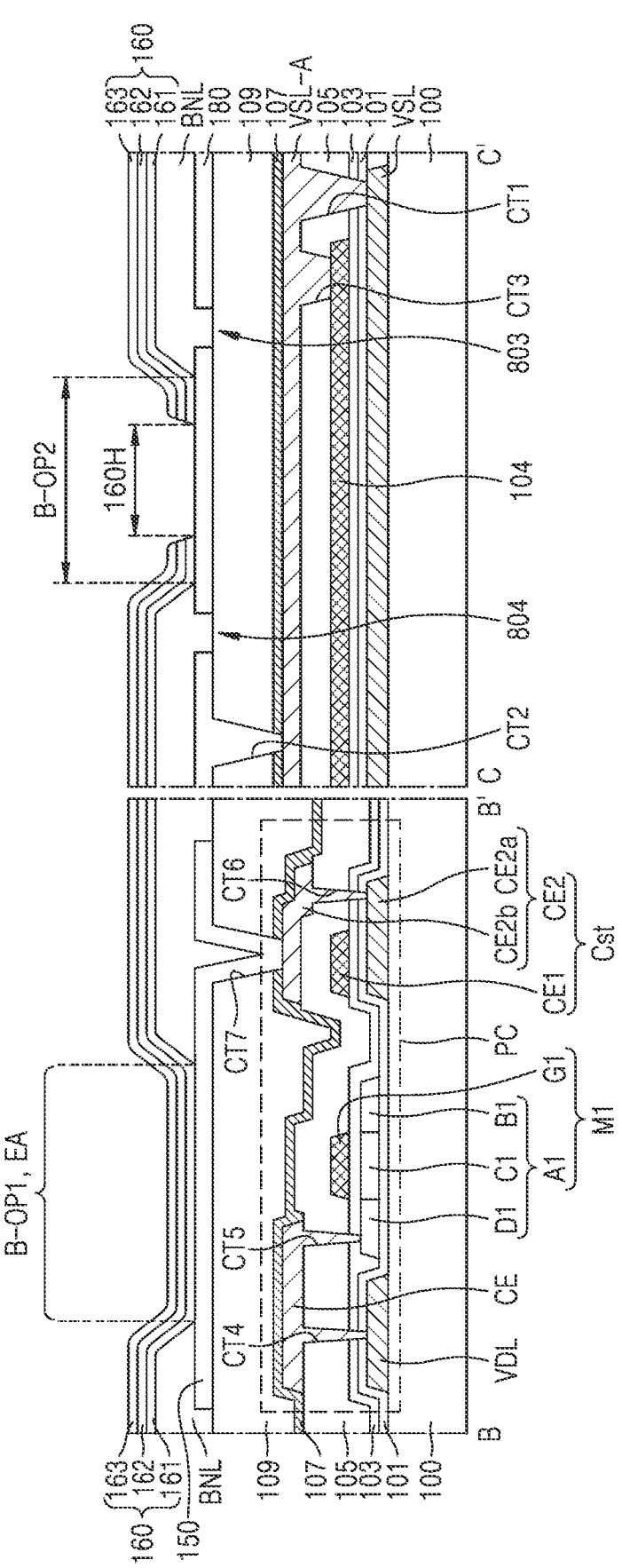
Figure 15B:
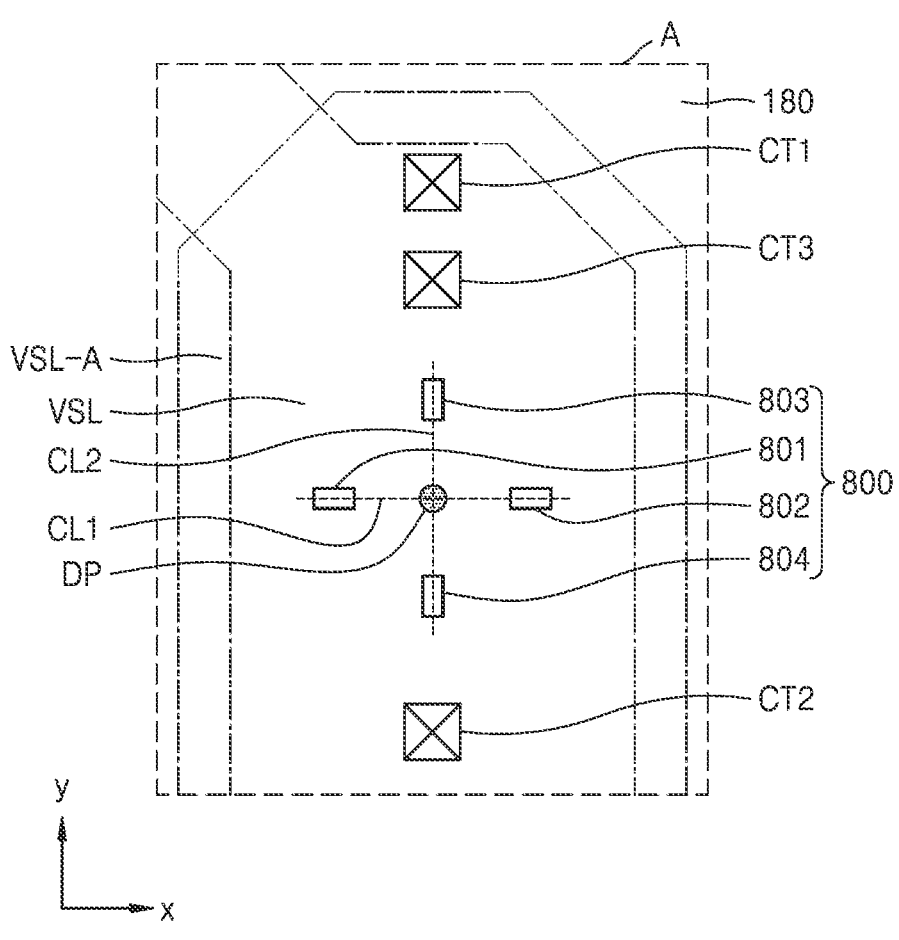
Figure 15C:
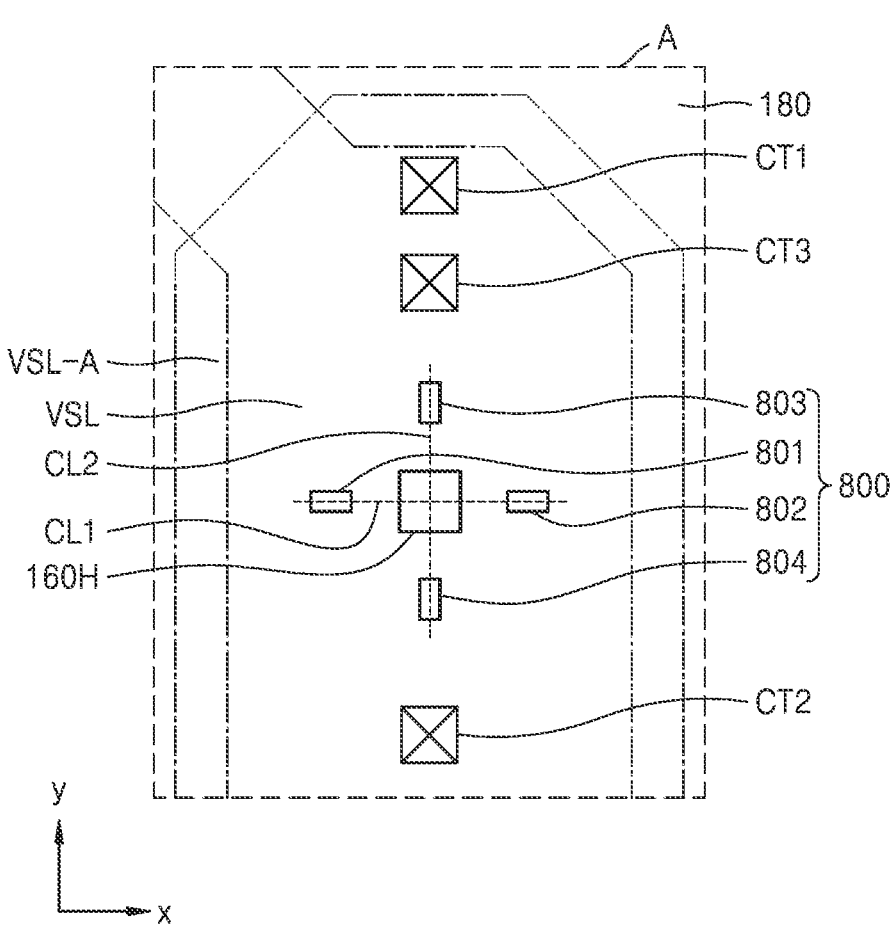

Thereafter, referring to FIGS. 15A through 15C, a hole 160H exposing a portion of the auxiliary electrode 180 may be formed by irradiating a laser beam to the intermediate layer 160 overlapping with the auxiliary electrode 180 while using the intaglio patterns 800.

In this case, the forming of the hole 160H may include recognizing the intaglio patterns 800, determining (e.g., setting) an irradiation point DP of a laser beam by using the recognized intaglio patterns 800, and forming the hole 160H exposing a portion of the auxiliary electrode 180 by irradiating the laser beam to the determined irradiation point DP of the laser beam.

First, the intaglio patterns 800 formed in the auxiliary electrode 180 may be recognized. In an embodiment, the intaglio patterns 800 formed in the auxiliary electrode 180 may be recognized (e.g., photographed) through a vision unit (e.g., a camera or sensor). For example, the vision unit may be a device (e.g., a camera or a sensor) capable of recognizing (e.g., photographing) the intaglio patterns 800 formed on the auxiliary electrode 180. The vision unit may recognize (e.g., photograph) the first intaglio pattern 801, the second intaglio pattern 802, the third intaglio pattern 803, and the fourth intaglio pattern 804.

After the intaglio patterns 800 are recognized (e.g., photographed), the irradiation point DP of the laser beam may be determined (e.g., may be set or calculated) using the recognized intaglio patterns 800.

In more detail, in the determining (e.g., setting or calculating) of the irradiation point DP of the laser beam, a point, at which a first imaginary line CL1 passing through the first intaglio pattern 801 and the second intaglio pattern 802 meets (e.g., crosses or intersects) a second imaginary line CL2 passing through the third intaglio pattern 803 and fourth intaglio pattern 804, may be determined (e.g., set or calculated) as the irradiation point DP of the laser beam.

In this case, the first imaginary line CL1 may extend in the first direction (e.g., the x direction), and the second imaginary line CL2 may extend in the second direction (e.g., the y direction). However, the present disclosure is not limited thereto. For example, in some embodiments, the first imaginary line CL1 may extend in a direction that is diagonal to the first direction (e.g., the x direction) and/or the second direction (e.g., the y direction). The second imaginary line CL2 may extend in a direction crossing (e.g., perpendicularly crossing) the first imaginary line CL1 extending in the diagonal direction.

Thereafter, the hole 160H may be formed in the intermediate layer 160 by irradiating the laser beam to the determined irradiation point DP of the laser beam.

After the irradiation point DP of the laser beam is determined (e.g., set or calculated) using the intaglio patterns 800, the hole 160H exposing a portion of the auxiliary electrode 180 may be formed in the intermediate layer 160 overlapping with the auxiliary electrode 180 by irradiating the laser beam to the determined irradiation point DP. The hole 160H exposing a portion of the auxiliary electrode 180 may overlap with the second bank opening B-OP2, and may be located in the second bank opening B-OP2.

In an embodiment, a hole in the first functional layer 161, a hole in the emission layer 162, and a hole in the second functional layer 163 may be formed by a laser beam. The center of the hole in the emission layer 162 may coincide with the center of the hole in the first functional layer 161 and/or the center of the hole in the second functional layer 163. In this case, the size of the hole in the first functional layer 161, the size of the hole in the emission layer 162, and the size of the hole in the second functional layer 163 may be the same or substantially the same as each other, or may be different from each other.

The hole 160H of the intermediate layer 160 may be formed while the hole in the first functional layer 161, the hole in the emission layer 162, and the hole in the second functional layer 163 overlap with one another.

In an embodiment, an ultraviolet (UV) laser having a wavelength of about 300 nm to about 400 nm may be used as the laser beam, and an output per unit area thereof may be about 200 mJ/cm$^2$ or less. However, the present disclosure is not limited thereto. As the laser beam, UV lasers having various suitable wavelengths may be used, and the output per unit area thereof may be about 200 mJ/cm$^2$ or more.

In this case, the laser beam may be in the form of a Gaussian beam. In this case, the laser beam may have the highest energy density at the center, and the energy density of the laser beam may decrease as a distance from the center of the laser beam increases.

The hole 160H formed through the laser beam may be formed at a point where the first imaginary line CL1 in the first direction (e.g., the x direction) passing through the first intaglio pattern 801 and the second intaglio pattern 802 meets the second imaginary line CL2 in the second direction (e.g., the y direction) passing through the third intaglio pattern 803 and the fourth intaglio pattern 804.

Figure 16:
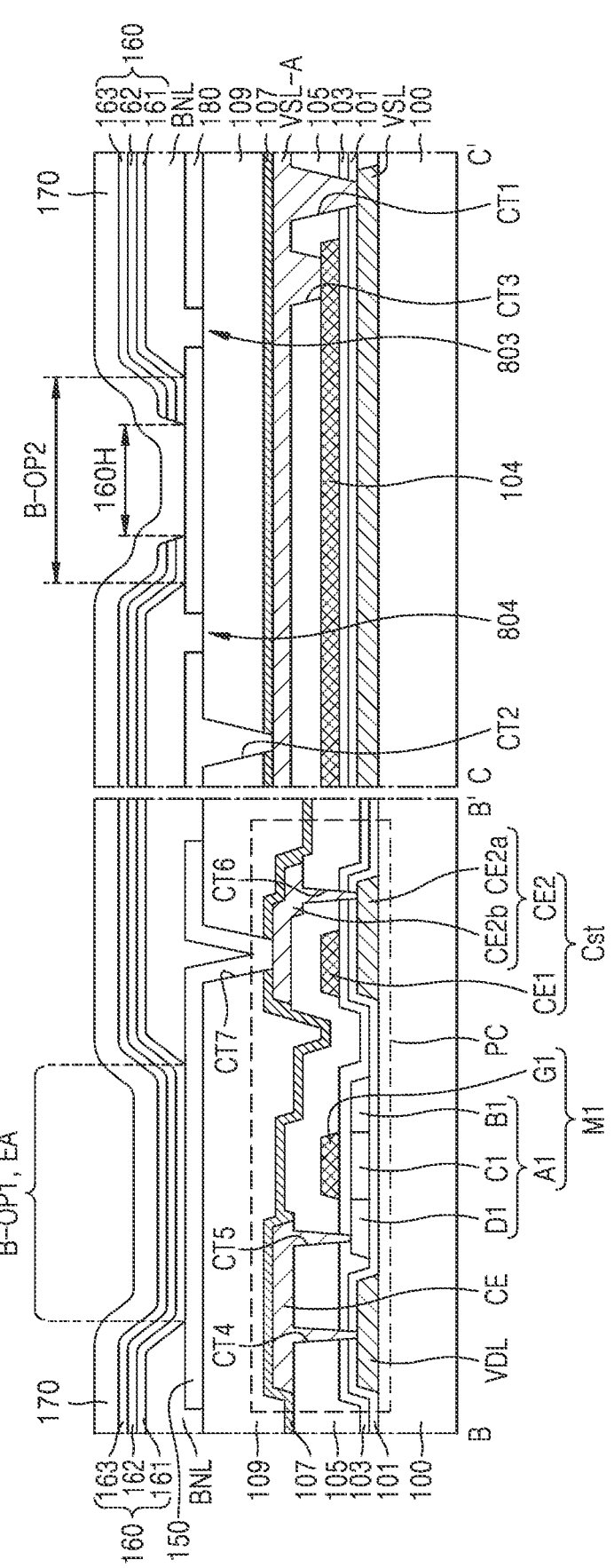

Referring to FIG. 16, after the forming of the hole 160H exposing a portion of the auxiliary electrode 180 by irradiating a laser beam to the intermediate layer 160 overlapping with the auxiliary electrode 180 by using the intaglio patterns 800, a second electrode 170 may be formed on the auxiliary electrode 180 and the intermediate layer 160.

After the hole 160H exposing a portion of the auxiliary electrode 180 overlapping with the second bank opening B-OP2 is formed by irradiating a laser beam on the intermediate layer 160, the second electrode 170 may be formed on the hole 160H, which exposes a portion of the auxiliary electrode 180, and the intermediate layer 160. The second electrode 170 may include a conductive material having a low work function. For example, the second electrode 170 may include a (semi) transparent layer including Ag, Mg, A1, Pt, Pd, Au, Ni, Nd, Ir, Cr, lithium (Li), calcium (Ca), or a suitable alloy thereof. As another example, the second electrode 170 may further include a layer including ITO, IZO, ZnO, or In$_2$O$_3$ on the (semi) transparent layer including one or more of the aforementioned materials.

The auxiliary electrode 180 and the second electrode 170 may directly contact each other through the hole 160H exposing a portion of the auxiliary electrode 180, and thus, may be electrically connected to each other. A contact area between the second electrode 170 and the auxiliary electrode 180 may be located in the second bank opening B-OP2.

In an embodiment, after the intaglio patterns 800 are formed in the auxiliary electrode 180, the irradiation point DP of the laser beam may be easily determined by using the intaglio patterns 800 as guide patterns. In addition, by using the intaglio patterns 800 as guide patterns to easily determine the irradiation point DP of the laser beam, a precision of the process of forming the hole 160H in the intermediate layer 160 may be improved.

Thereafter, the encapsulation layer 400 may be formed on the second electrode 170, and the color conversion-transmitting layer 500, the color layer 600, and the light-transmitting base layer 700 may be formed on the encapsulation layer 400.

The common power supply voltage ELVSS may be applied to the second electrode 170 through wiring lines arranged at (e.g., in or on) the non-display area NDA. However, when the size of the display apparatus increases, or the thickness of the second electrode 170 decreases, the resistance of the second electrode 170 may increase, which may cause a voltage drop (e.g., an IR drop) to occur, resulting in non-uniformity in luminance.

In an embodiment, the common power supply voltage ELVSS may be applied to the second electrode 170 through wiring lines arranged at (e.g., in or on) the display area DA.

In more detail, the common power supply voltage ELVSS may be applied to the second electrode 170 through the common voltage line VSL and the auxiliary common voltage line VSL-A arranged at (e.g., in or on) the display area DA.

For example, the auxiliary common voltage line VSL-A and the common voltage line VSL may be electrically connected to each other through the first contact hole CT1, the auxiliary common voltage line VSL-A and the auxiliary electrode 180 may be electrically connected to each other through the second contact hole CT2, and the auxiliary electrode 180 and the second electrode 170 may be electrically connected to each other through the hole 160H defined in the intermediate layer 160. Therefore, the second electrode 170 may be electrically connected to the auxiliary common voltage line VSL-A and/or the common voltage line VSL through the auxiliary electrode 180. Also, because the second electrode 170 may be electrically connected to the auxiliary common voltage line VSL-A and/or the common voltage line VSL, the second electrode 170 may receive the common power supply voltage ELVSS through the auxiliary common voltage line VSL-A and/or the common voltage line VSL.

In this case, the common voltage line VSL and the auxiliary common voltage line VSL-A may be disposed at (e.g., in or on) different layers from each other. As a wiring line for transmitting the common power supply voltage ELVSS is provided not as a single line, but as two lines (e.g., the common voltage line VSL and the auxiliary common voltage line VSL-A) disposed at (e.g., in or on) different layers from each other, the resistance of the wiring line for transmitting the common power supply voltage ELVSS may be reduced. Accordingly, the voltage drop may be prevented or reduced, and a luminance deviation between pixels may be prevented or substantially prevented from occurring, thereby displaying an image of uniform or substantially uniform quality.

In an embodiment, the auxiliary common voltage line VSL-A may be electrically connected to the conductive layer 104 through the third contact hole CT3. As the auxiliary common voltage line VSL-A is electrically connected to the conductive layer 104, the resistance of the wiring line for transmitting the common power supply voltage ELVSS may be further reduced.

According to one or more embodiments of the present disclosure, the quality of a contact area between an auxiliary electrode and a second electrode on the auxiliary electrode may be secured by forming a hole in an intermediate layer by using intaglio patterns formed in the auxiliary electrode. In addition, according to one or more embodiments of the present disclosure, it may be possible to provide a clear image.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display apparatus comprising:
a substrate;
an organic insulating layer on the substrate;
a first electrode on the organic insulating layer;
an auxiliary electrode on the organic insulating layer;
intaglio patterns in the auxiliary electrode;
a bank layer having a first bank opening overlapping with the first electrode, and a second bank opening overlapping with the auxiliary electrode;
an intermediate layer on the first electrode and the auxiliary electrode, the intermediate layer having a hole exposing a portion of the auxiliary electrode; and
a second electrode on the intermediate layer to overlap with the first electrode and the auxiliary electrode, and contacting the portion of the auxiliary electrode exposed through the hole in the intermediate layer.

2. The display apparatus of claim 1, wherein the intaglio patterns comprise a first intaglio pattern, and a second intaglio pattern spaced from the first intaglio pattern in a first direction with respect to the hole.

3. The display apparatus of claim 2, wherein the intaglio patterns further comprise a third intaglio pattern, and a fourth intaglio pattern spaced from the third intaglio pattern in a second direction crossing the first direction with respect to the hole.

4. The display apparatus of claim 1, wherein each of the intaglio patterns has a rectangular shape.

5. The display apparatus of claim 1, wherein each of the intaglio patterns has a polygonal shape.

6. The display apparatus of claim 1, wherein the intaglio patterns are on the organic insulating layer.

7. The display apparatus of claim 1, further comprising:
a common voltage line on the substrate; and
an auxiliary common voltage line overlapping with the common voltage line, and electrically connected to the common voltage line through a first contact hole defined in at least one insulating layer located between the auxiliary common voltage line and the common voltage line.

8. The display apparatus of claim 7, further comprising an inorganic insulating layer in direct contact with an upper surface of the auxiliary common voltage line.

9. The display apparatus of claim 8, wherein the auxiliary electrode is electrically connected to the auxiliary common voltage line through a second contact hole defined in the inorganic insulating layer and the organic insulating layer.

10. The display apparatus of claim 1, wherein the intermediate layer comprises an emission layer, and
wherein the hole in the intermediate layer penetrates through the emission layer.

11. A method of manufacturing a display apparatus, the method comprising:
forming an organic insulating layer on a substrate;
forming a conductive material layer on the organic insulating layer;
forming a first electrode, an auxiliary electrode, and intaglio patterns by patterning the conductive material layer;

forming a bank layer on the first electrode, the auxiliary electrode, and the intaglio patterns, the bank layer having a first bank opening and a second bank opening;

forming an intermediate layer on the first electrode, the auxiliary electrode, and the bank layer; and forming a hole exposing a portion of the auxiliary electrode by irradiating a laser beam to the intermediate layer overlapping with the auxiliary electrode, by utilizing the intaglio patterns.

12. The method of claim 11, wherein the forming of the hole comprises:

recognizing the intaglio patterns;

determining an irradiation point of the laser beam by utilizing the recognized intaglio patterns; and forming the hole exposing the portion of the auxiliary electrode, by irradiating the laser beam to the determined irradiation point of the laser beam.

13. The method of claim 12, wherein the intaglio patterns comprise a first intaglio pattern, and a second intaglio pattern spaced from the first intaglio pattern in a first direction.

14. The method of claim 13, wherein the intaglio patterns further comprise a third intaglio pattern, and a fourth intaglio pattern spaced from the third intaglio pattern in a second direction crossing the first direction.

15. The method of claim 14, wherein the recognizing of the intaglio patterns comprises recognizing the first intaglio pattern, the second intaglio pattern, the third intaglio pattern, and the fourth intaglio pattern.

16. The method of claim 15, wherein the irradiation point of the laser beam is a point at which a first imaginary line passing through the first intaglio pattern and the second intaglio pattern intersects a second imaginary line passing through the third intaglio pattern and the fourth intaglio pattern.

17. The method of claim 11, wherein each of the intaglio patterns has a rectangular shape.

18. The method of claim 11, wherein each of the intaglio patterns has a polygonal shape.

19. The method of claim 11, wherein the intaglio patterns are formed concurrently with the first electrode and the auxiliary electrode when the first electrode and the auxiliary electrode are formed.

20. The method of claim 11, further comprising forming a second electrode on the auxiliary electrode and the intermediate layer.

* * * * *